US012701769B2

(12) United States Patent
Xiao et al.

(10) Patent No.: US 12,701,769 B2
(45) Date of Patent: Aug. 4, 2026

(54) SEMICONDUCTOR STRUCTURE AND METHOD FOR MANUFACTURING THE SAME

(71) Applicant: Taiwan Semiconductor Manufacturing Company, Ltd., Hsinchu (TW)

(72) Inventors: Zhi-Ren Xiao, Hsinchu County (TW); Nuo Xu, San Jose, CA (US); Chih-Ching Wang, Kinmen County (TW); Jon-Hsu Ho, New Taipei City (TW); Chung-Wei Wu, Ju-Bei City (TW); Zhiqiang Wu, Hsinchu County (TW)

(73) Assignee: TAIWAN SEMICONDUCTOR MANUFACTURING, LTD., Hsinchu (TW)

( * ) Notice: Subject to any disclaimer, the term of this patent is extended or adjusted under 35 U.S.C. 154(b) by 383 days.

(21) Appl. No.: 18/419,726

(22) Filed: Jan. 23, 2024

(65) Prior Publication Data

US 2025/0241041 A1 Jul. 24, 2025

(51) Int. Cl.
| | |
|---|---|
| *H10D 64/23* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/83* | (2025.01) |

(52) U.S. Cl.
CPC ......... *H10D 64/258* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 64/018* (2025.01); *H10D 84/83* (2025.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge | |
| 9,236,267 B2 | 1/2016 | De | |
| 9,412,817 B2 | 8/2016 | Yang | |

(Continued)

FOREIGN PATENT DOCUMENTS

| | | | | | |
|---|---|---|---|---|---|
| CN | 114520192 A | * | 5/2022 | .......... | H10W 10/011 |
| CN | 115863384 A | * | 3/2023 | ......... | H10D 84/0128 |

(Continued)

*Primary Examiner* — Michael Lebentritt
(74) *Attorney, Agent, or Firm* — McClure, Qualey & Rodack, LLP

(57) ABSTRACT

A semiconductor structure includes a substrate, nanostructures, source/drain features, a gate structure, and inner spacers. The nanostructures are over the substrate and spaced apart from each other in a Z-direction. The source/drain features are electrically connected to and on opposite sides of the nanostructures in an X-direction. The gate structure extends in a Y-direction and wraps around the nanostructures. The inner spacers are between the nanostructures in the Z-direction. Each of the inner spacers includes a soft core layer and a hard liner layer wrapping around the soft core layer.

20 Claims, 26 Drawing Sheets

(56)          References Cited

U.S. PATENT DOCUMENTS

| | | | |
|---|---|---|---|
| 9,412,828 B2 | 8/2016 | Ching | |
| 9,472,618 B2 | 10/2016 | Oxland | |
| 9,502,265 B1 | 11/2016 | Jiang | |
| 9,520,482 B1 | 12/2016 | Chang | |
| 9,536,738 B2 | 1/2017 | Huang | |
| 9,576,814 B2 | 2/2017 | Wu | |
| 9,608,116 B2 | 3/2017 | Ching | |
| 2020/0105761 A1* | 4/2020 | Liaw | H10D 84/0167 |
| 2021/0184016 A1* | 6/2021 | Cheng | H10D 30/025 |
| 2023/0411468 A1* | 12/2023 | Liaw | H10D 30/6729 |
| 2024/0113214 A1* | 4/2024 | Chang | H10D 64/679 |
| 2024/0136427 A1* | 4/2024 | Su | H10D 64/017 |

FOREIGN PATENT DOCUMENTS

| | | | | | |
|---|---|---|---|---|---|
| CN | 118412324 A | * | 7/2024 | | H10D 84/834 |
| DE | 102020113993 A1 | * | 4/2021 | | H10P 76/204 |
| TW | 202127663 A | * | 7/2021 | | H10P 50/642 |

* cited by examiner

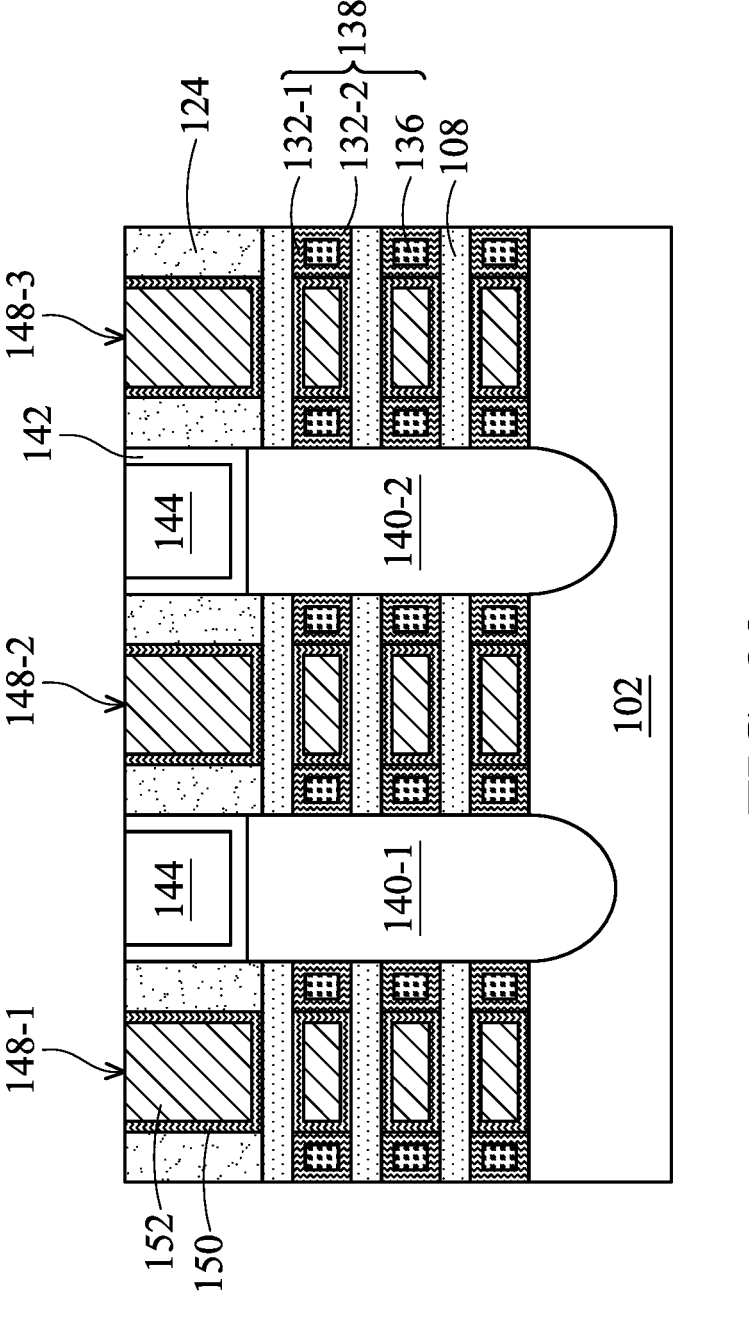
FIG. 23
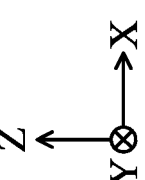

100

160

124

148-3

142
156

140-2

148-2

154 142
144

140-1

148-1

152
150

132-1
132-2 } 138
136
108

102

SEMICONDUCTOR STRUCTURE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) devices have been incorporated into memory devices (including, for example, static random-access memory, or SRAM, cells) and core devices (including, for example, standard logic, or STD, cells) to reduce chip footprint while maintaining reasonable processing margins.

However, as GAA devices continue to be scaled down, conventional methods for manufacturing GAA devices may experience challenges. Accordingly, although existing technologies for fabricating GAA devices have been generally adequate for their intended purposes, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10, 11, 12, 13, 14, 15, 16, 17, 18, 19, 20, 21, 22, 23, and 24 are X-Z cross-sectional views of the workpiece at various fabrication stages along a line A-A' of FIG. 9, in accordance with some embodiments of the present disclosure.

DETAILED DESCRIPTION

Figure 1:
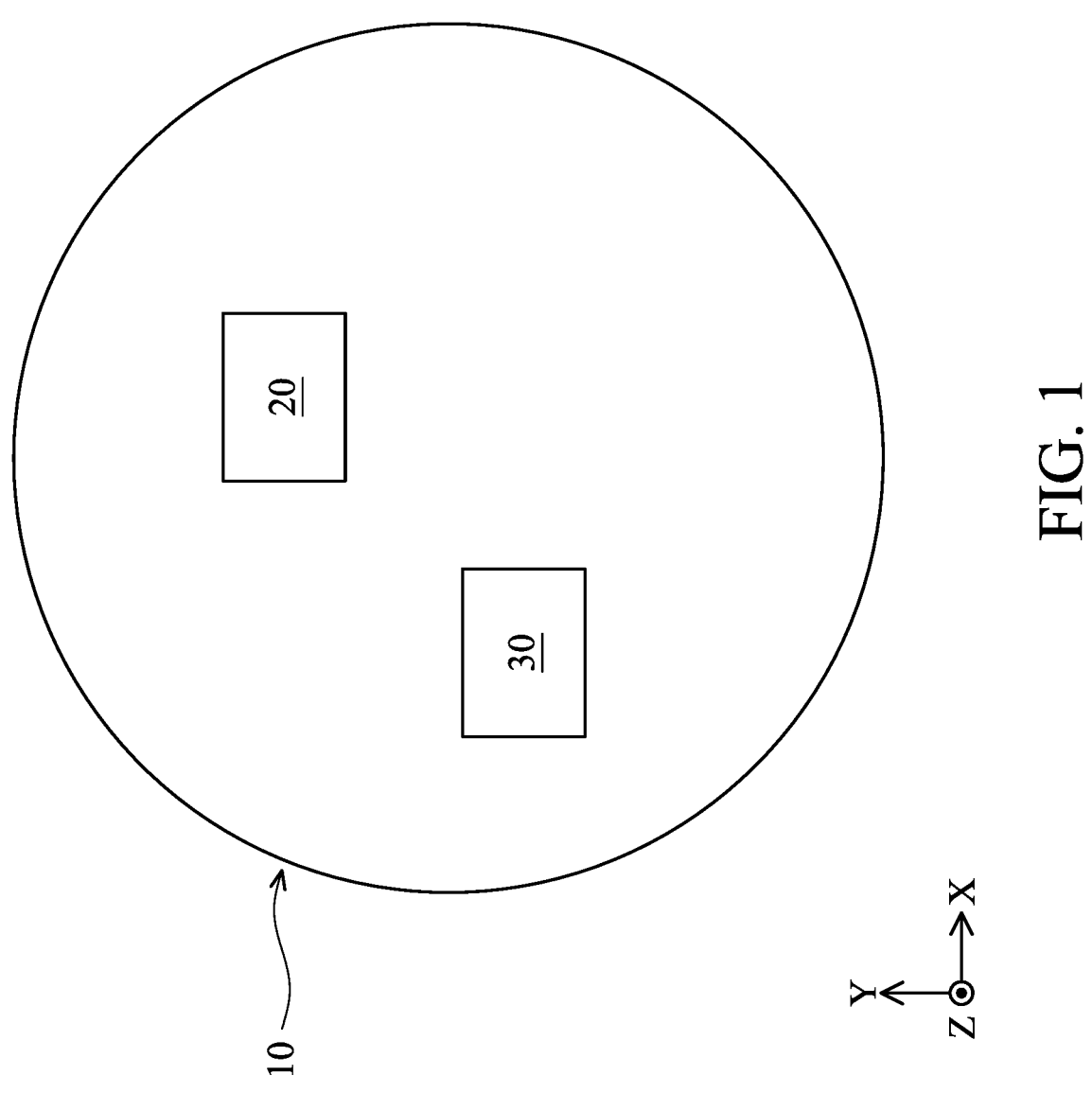
FIG. 1 illustrates a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures with field-effect transistors (FETs), such as three-dimensional gate-all-around (GAA) transistors, in memory (e.g., SRAM) and/or standard logic cells of an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications. While existing technologies for fabricating GAA transistors have been generally adequate for their intended applications, they have not been entirely satisfactory in all aspects.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including P-type GAA transistors with inner spacers having soft core layers wrapped around by hard liner layers, such that the compressive stress from source/drain features to channels in the P-type GAA transistors are improved, thereby improving the performance of the P-type GAA transistors. The details of the structure and manufacturing methods of the present disclosure are described below in conjunction with the accompanying drawings, which illustrate the process of making GAA transistors, according to some embodiments.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise indicated.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, P-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or a combination thereof.

The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. In some embodiments, the IC chip 10 includes a memory region 20 and a logic region 30.

The memory region 20 can include an array of memory cells, each of which includes transistors and interconnection structures (also referred to as routing structures) that combine to provide a storage device and/or a storage function, such as a flip flop, a latch, other suitable memory devices, or combinations thereof. In some embodiments, the memory region 20 is configured with static random-access memory (SRAM) cells, dynamic random-access memory (DRAM) cells, non-volatile random-access memory (NVRAM) cells, flash memory cells, other suitable memory cells, or combinations thereof.

The logic region 30 can include an array of circuit cells having various logic cells or standard (STD) cells. The logic cells or STD cells may include transistors and interconnection structures that combine to provide a logic device and/or a logic function, such as an inverter, an AND, an NAND, an OR, an NOR, a NOT, an XOR, an XNOR, other suitable logic devices, or combinations thereof. FIG. 1 has been simplified for the sake of clarity to better understand the inventive concepts of the present disclosure. Additional features can be added in IC chip 10, and some of the features described herein can be replaced, modified, or eliminated in other embodiments of the IC chip 10.

FIGS. 2A to 2E are circuit schematics of various STD cells in the array of circuit cells in the logic region 30 of the IC chip 10, in accordance with some embodiments of the present disclosure.

Figure 2C:
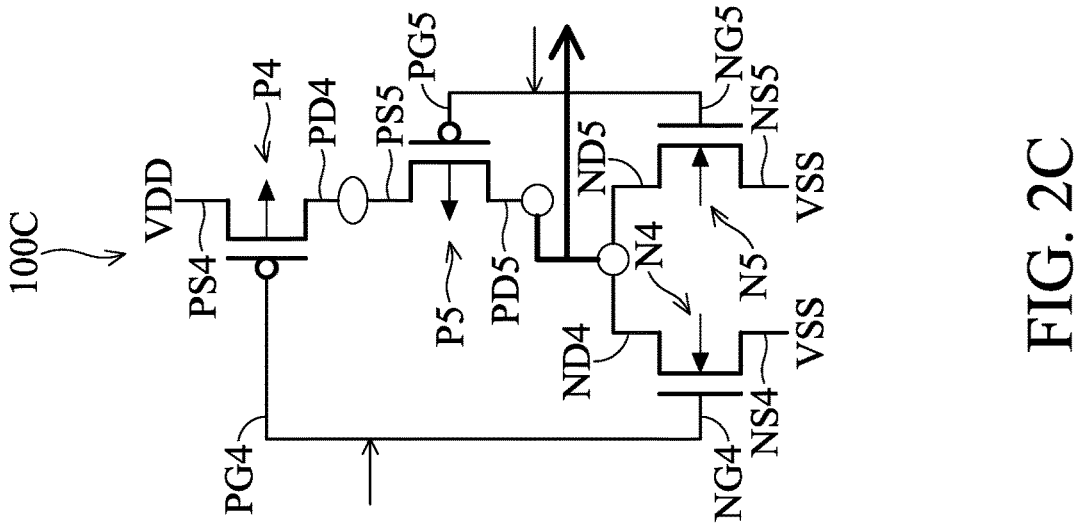
FIGS. 2A, 2B, and 2C illustrate circuit schematics of various STD cells that can be implemented in the logic region of the IC chip of FIG. 1 in accordance with some embodiments of the present disclosure.
Figure 2B:
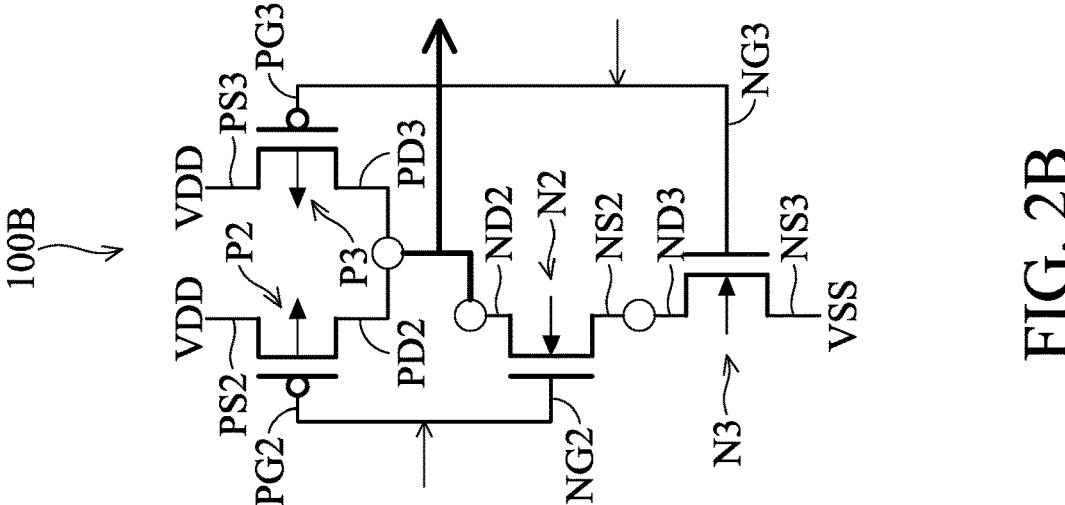
Figure 2A:
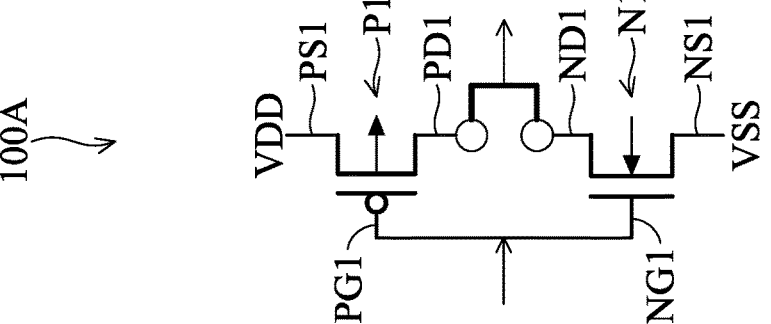

FIG. 2A shows an inverter 100A including an N-type transistor N1 and a P-type transistor P1. The N-type transistor N1 includes a source terminal NS1, a drain terminal ND1, and a gate terminal NG1, and the P-type transistor P1 includes a source terminal PS1, a drain terminal PD1, and a gate terminal PG1.

As shown in FIG. 2A, the gate terminals NG1 and PG1 are coupled with each other to operate as an input terminal of the inverter 100A. The drain terminals ND1 and PD1 are coupled with each other to operate as an output terminal of the inverter 100A. The source terminal PS1 is coupled to a VDD voltage. The source terminal NS1 is coupled to a VSS voltage (or a ground voltage).

FIG. 2B shows a NAND (also referred to as a NAND logic gate, a NAND device or a NAND cell) 100B including N-type transistors N2, N3 and P-type transistors P2, P3. The N-type transistor N2 includes a source terminal NS2, a drain terminal ND2, and a gate terminal NG2, and the N-type transistor N3 includes a source terminal NS3, a drain terminal ND3, and a gate terminal NG3. The P-type transistor P2 includes a source terminal PS2, a drain terminal PD2, and a gate terminal PG2, and the P-type transistor P3 includes a source terminal PS3, a drain terminal PD3, and a gate terminal PG3.

As shown in FIG. 2B, the gate terminals NG2 and PG2 are coupled with each other to operate as a first input terminal of the NAND 100B, and the gate terminals NG3 and PG3 are coupled with each other to operate as a second input terminal of the NAND 100B. The drain terminals ND2, PD2, and PD3 are coupled with each other to operate as an output terminal of the NAND 100B. In some embodiments, the connection of the drain terminals ND2, PD2, and PD3 are referred to as a "common drain." The source terminals PS2 and PS3 are coupled to the VDD voltage. The source terminal NS3 is coupled to VSS voltage (or a ground voltage). The source terminal NS2 and drain terminal ND3 are coupled with each other.

FIG. 2C shows a NOR (also referred to as a NOR logic gate, a NOR device or a NOR cell) 100C including N-type transistors N4, N5 and P-type transistors P4, P5. The N-type transistor N4 includes a source terminal NS4, a drain terminal ND4, and a gate terminal NG4, and the N-type transistor N5 includes a source terminal NS5, a drain terminal ND5, and a gate terminal NG5. The P-type transistor P4 includes a source terminal PS4, a drain terminal PD4, and a gate terminal PG4, and the P-type transistor P5 includes a source terminal PS5, a drain terminal PD5, and a gate terminal PG5.

As shown in FIG. 2C, the gate terminals NG4 and PG4 are coupled with each other to operate as a first input terminal of the NOR 100C, and the gate terminals NG5 and PG5 are coupled with each other to operate as a second input terminal of the NOR 100C. The drain terminals ND4, ND5, and PD5 are coupled with each other to operate as an output terminal of the NOR 100C. In some embodiments, the connection of the drain terminals ND4, ND5, and PD5 are referred to as "common drain." The source terminal PS4 is coupled to the VDD voltage. The source terminals NS4 and NS5 are coupled to VSS voltage (or a ground voltage). The source terminal PS5 and drain terminal PD4 are coupled with each other.

Figures 3, 4:
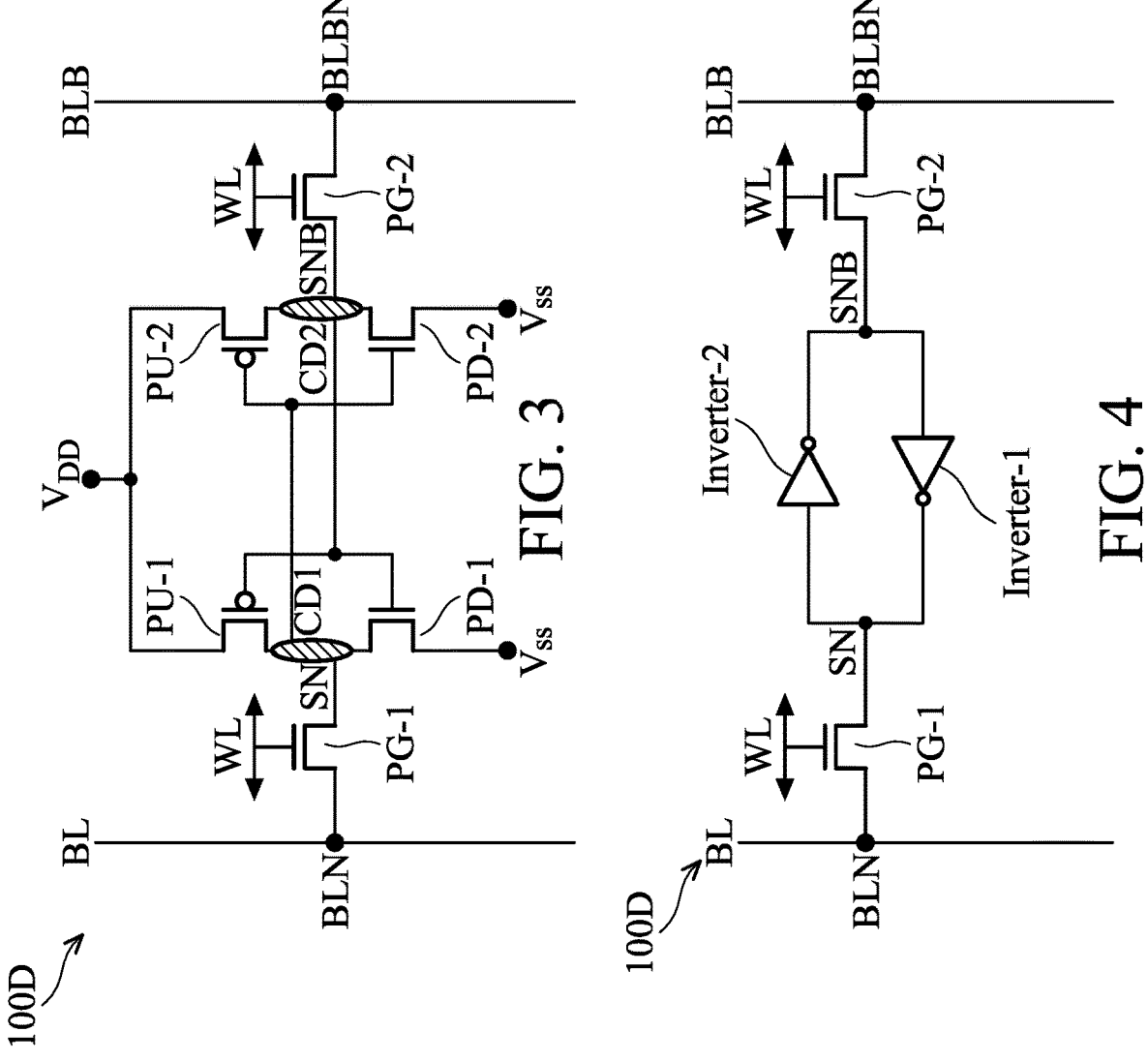
FIGS. 3 and 4 illustrate circuit schematics of a static random access memory (SRAM) cell that can be implemented in the memory region of the IC chip of FIG. 1, in accordance with some embodiments of the present disclosure.

FIGS. 3 and 4 are circuit diagrams of an SRAM circuit that can be implemented in an SRAM cell of an array in the memory region 20 of FIG. 1, in accordance with some embodiments of the present disclosure. The circuit diagram of SRAM cell is merely exemplary, and in some embodiments, each of SRAM cells in the array is configured with an SRAM circuit similar to the SRAM cells 100D as shown in FIGS. 2 and 3. For example, each of SRAM cells has a storage portion that includes a cross-coupled pair of inverters (also referred to as a latch), such as an Inverter-1 and an Inverter-2. Inverter-1 includes pull-up transistor PU-1 and pull-down transistor PD-1, and Inverter-2 includes pull-up transistor PU-2 and pull-down transistor PD-2. Pass-gate transistor PG-1 is connected to an output of Inverter-1 and an input of Inverter-2, and pass-gate transistor PG-2 is connected to an output of Inverter-2 and an input of Inverter-1.

In operation, pass-gate transistor PG-1 and pass-gate transistor PG-2 provide access to the storage portion of their respective SRAM cell (i.e., Inverter-1 and Inverter-2) and can also be referred to as access transistors of their respective SRAM cell. Each of SRAM cells is connected to and powered through a first power supply voltage, such as a positive power supply voltage, and a second power supply voltage, such as a ground voltage or a reference voltage (which can be an electrical ground).

A gate of pull-up transistor PU-1 interposes a source, which is electrically coupled to the first power supply voltage via a voltage node (or voltage source) $V_{DD}$, and a first common drain (CD1) (i.e., a drain of pull-up transistor PU-1 and a drain of pull-down transistor PD-1). A gate of pull-down transistor PD-1 interposes a source, which is electrically coupled to the second power supply voltage via a voltage node (or voltage source) $V_{SS}$, and the first common drain.

A gate of pull-up transistor PU-2 interposes a source, which is electrically coupled to the first power supply voltage via voltage node $V_{DD}$, and a second common drain (CD-2) (i.e., a drain of pull-up transistor PU-2 and a drain of pull-down transistor PD-2). A gate of pull-down transistor PD-2 interposes a source, which is electrically coupled to the second power supply voltage via voltage node $V_{SS}$, and the second common drain.

The first common drain provides a storage node SN that stores data in true form, and the second common drain provides a storage node SNB that stores data in complementary form, or vice versa, in some embodiments. The gate of pull-up transistor PU1 and the gate of pull-down transistor PD-1 are coupled together and to the second common drain SD2, and the gate of pull-up transistor PU-2 and the gate of pull-down transistor PD-2 are coupled together and to the first common drain SD1.

A gate of pass-gate transistor PG-1 interposes a drain connected to a bit line node BLN, which is electrically coupled to a bit line BL, and a source, which is electrically coupled to the first common drain SD1. A gate of pass-gate transistor PG-2 interposes a drain connected to a complementary bit line node BLBN, which is electrically coupled to a complementary bit line BLB, and a source, which is electrically coupled to the second common drain SD2.

Gates of pass-gate transistors PG-1, PG-2 are connected to and controlled by a word line WL, which allows selection of a respective SRAM cell for reading and/or writing. In some embodiments, pass-gate transistors PG-1, PG-2 provide access to storage nodes SN, SNB, respectively, each of which can store a bit (e.g., a logical 0 or a logical 1), during read operations and/or write operations. For example, pass-gate transistors PG-1, PG-2 couple storage nodes SN, SNB, respectively, to bit line BL and bit line bar BLB in response to voltage applied to the gates of the pass-gate transistors PG-1, PG-2 by the word line WL. In some embodiments, SRAM cells are single-port SRAMs. In some embodiments, SRAM cells are configured as multi-port SRAMs, such as dual-port SRAMs, and/or with more or less transistors than depicted, such as 8T SRAMs.

FIGS. 3 and 4 have been simplified for the sake of clarity to better understand the inventive concepts of the present disclosure. Additional features can be added in the SRAM circuits of FIGS. 3 and 4, and some of the features described herein can be replaced, modified, or eliminated in other embodiments of the SRAM circuits of FIGS. 3 and 4.

Each of the circuit cells and the SRAM cells discussed above is constructed by transistors. The transistors may be planar transistors, fin field-effect transistor (FinFET) transistors, gate-all-around (GAA) transistors, nano-wire transistors, nanosheet transistors, or a combination thereof. For the sake of providing an example, exemplary GAA transistors for the circuit cells and the SRAM cells discussed above are illustrated and described in below. More specifically, the manufacturing method and the structure of P-type GAA transistors with improved inner spacers for the circuit cells and the SRAM cells discussed above are illustrated and described in below. However, it should be understood that the application should not be limited to a particular type of device, except as specifically claimed.

FIGS. 5, 6, 7, 8, and 9 are perspective views of a workpiece 100 at various fabrication stages, in accordance with some embodiments of the present disclosure. FIGS. 10, 11, 12, 13, 14, 15, 16, 17, 18, 19, 20, 21, 22, 23, and 24 are X-Z cross-sectional views of the workpiece 100 at various fabrication stages along a line A-A' of FIG. 9, in accordance with some embodiments of the present disclosure.

Figure 5:
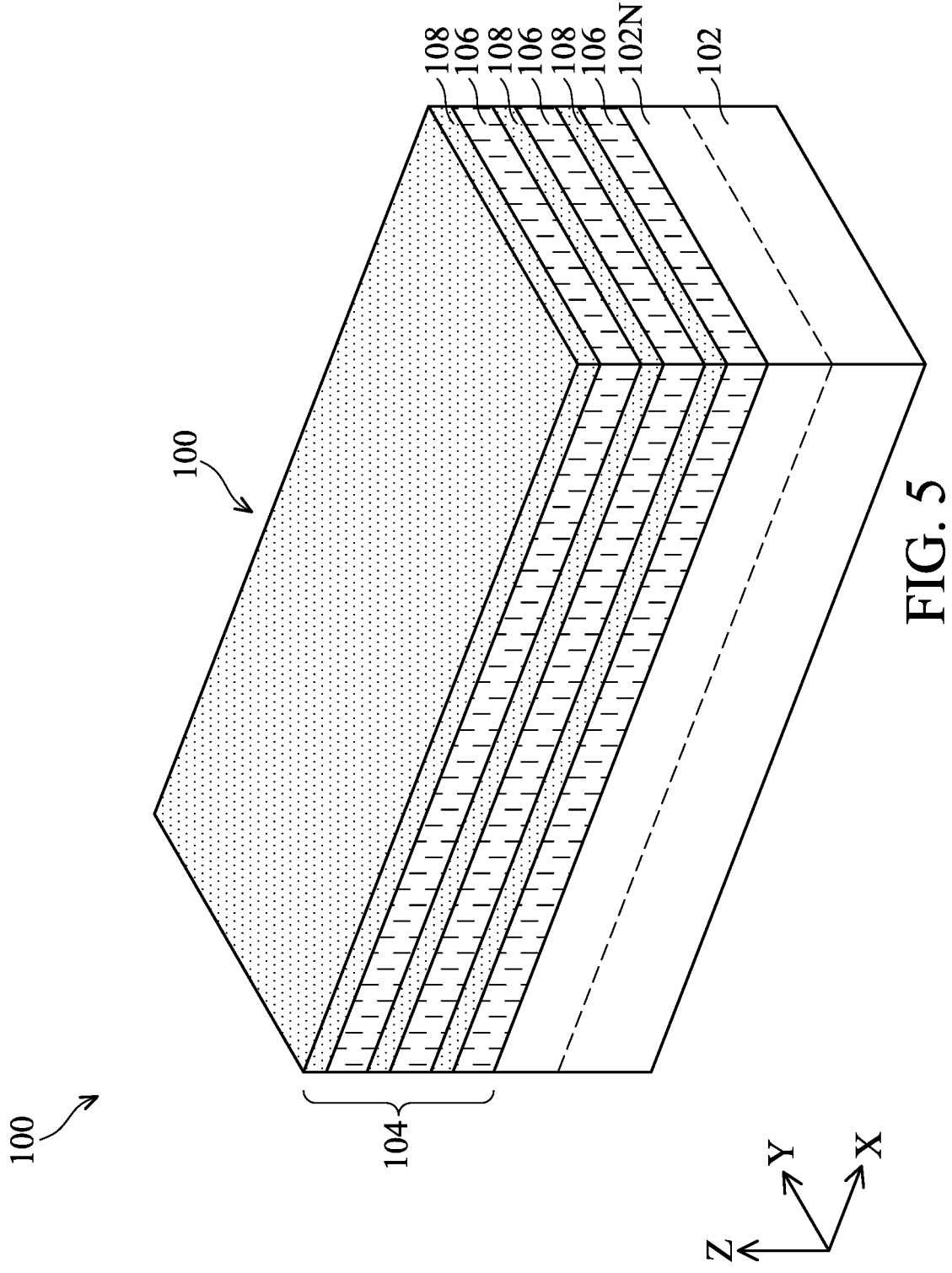
FIGS. 5, 6, 7, 8, and 9 are perspective views of a workpiece at various fabrication stages, in accordance with some embodiments of the present disclosure.

Referring to FIG. 5, the workpiece 100 is provided. The workpiece 100 may include a substrate 102 and a stack 104 over the substrate 102. In some embodiments, the substrate 102 contains a semiconductor material, such as bulk silicon (Si). Alternatively or additionally, in some other embodiments, another elementary semiconductor, such as germanium (Ge) in a crystalline structure, may also be included in the substrate 102. The substrate 102 may also include a compound semiconductor, such as silicon germanium (SiGe) or a III-V semiconductor material. Example III-V semiconductor materials may include silicon carbide (SiC), indium arsenide (InAs), indium antimonide (InSb), indium phosphide (InP), gallium arsenide (GaAs), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and/or indium gallium arsenide (InGaAs), or combinations thereof. The substrate 102 may also include an insulating layer, such as a silicon oxide layer, to have a semiconductor-on-insulator substrate, such as Si-on-insulator (SOI), SiGe-on-insulator (SGOI), Ge-on-insulator (GOI) substrates.

In some embodiments, the substrate 102 may include various doped regions configured according to design requirements of GAA transistors. In some embodiments, the substrate 102 may include a doped region 102N (also referred to as a well region). The doped region 102N may be an n-type doped region (also referred to as an n-well), and the n-type doped region is configured for P-type GAA transistors. N-type doped region is doped with n-type dopants, such as phosphorus (P), arsenic (As), other n-type dopant, or combinations thereof.

In the present embodiment, the substrate 102 shows one doped region 102N. In other embodiments, the substrate 102 may include multiple doped regions formed with a combination of P-type dopants and n-type dopants. An ion implantation process, a diffusion process, and/or other suitable doping process can be performed to form the doped region 102N. In some embodiments, the doped region 102N (n-type doped region) has an n-type dopant concentration of about $5 \times 10^{16}$ cm$^{-3}$ to about $5 \times 10^{19}$ cm$^{-3}$. Because the workpiece 100 will be fabricated into a semiconductor structure 100 upon conclusion of the fabrication processes, the workpiece 100 may be referred to as the semiconductor structure 100 as the context requires.

The stack 104 includes semiconductor layers 106 and 108, and the semiconductor layers 106 and 108 are alternatingly stacked in the Z-direction. The semiconductor layers 106 and the semiconductor layers 108 may have different semiconductor compositions. In some embodiments, semiconductor layers 106 are formed of silicon germanium (SiGe) and the semiconductor layers 108 are formed of silicon (Si). In these embodiments, the additional germanium content in the semiconductor layers 106 allow selective removal or recess of the semiconductor layers 106 without substantial damages to the semiconductor layers 108, so that the semiconductor layers 106 are also referred to as sacrificial layers.

In some embodiments, the semiconductor layers 106 and 108 are epitaxially grown over (on) the substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 106 and the semiconductor layers 108 are deposited alternatingly, one-after-another, to form the stack 104.

It should be noted that three (3) layers of the semiconductor layers 106 and three (3) layers of the semiconductor layers 108 are alternately and vertically arranged (or stacked) as shown in FIG. 5, which are for illustrative purposes only and not intended to be limiting beyond what is specifically recited in the claims. The number of layers depends on the desired number of channels members for the semiconductor device. In some embodiments, there may be from 2 to 10 semiconductor layers 106 alternating with 2 to 10 semiconductor layers 108 in the stack 104.

Figure 6:
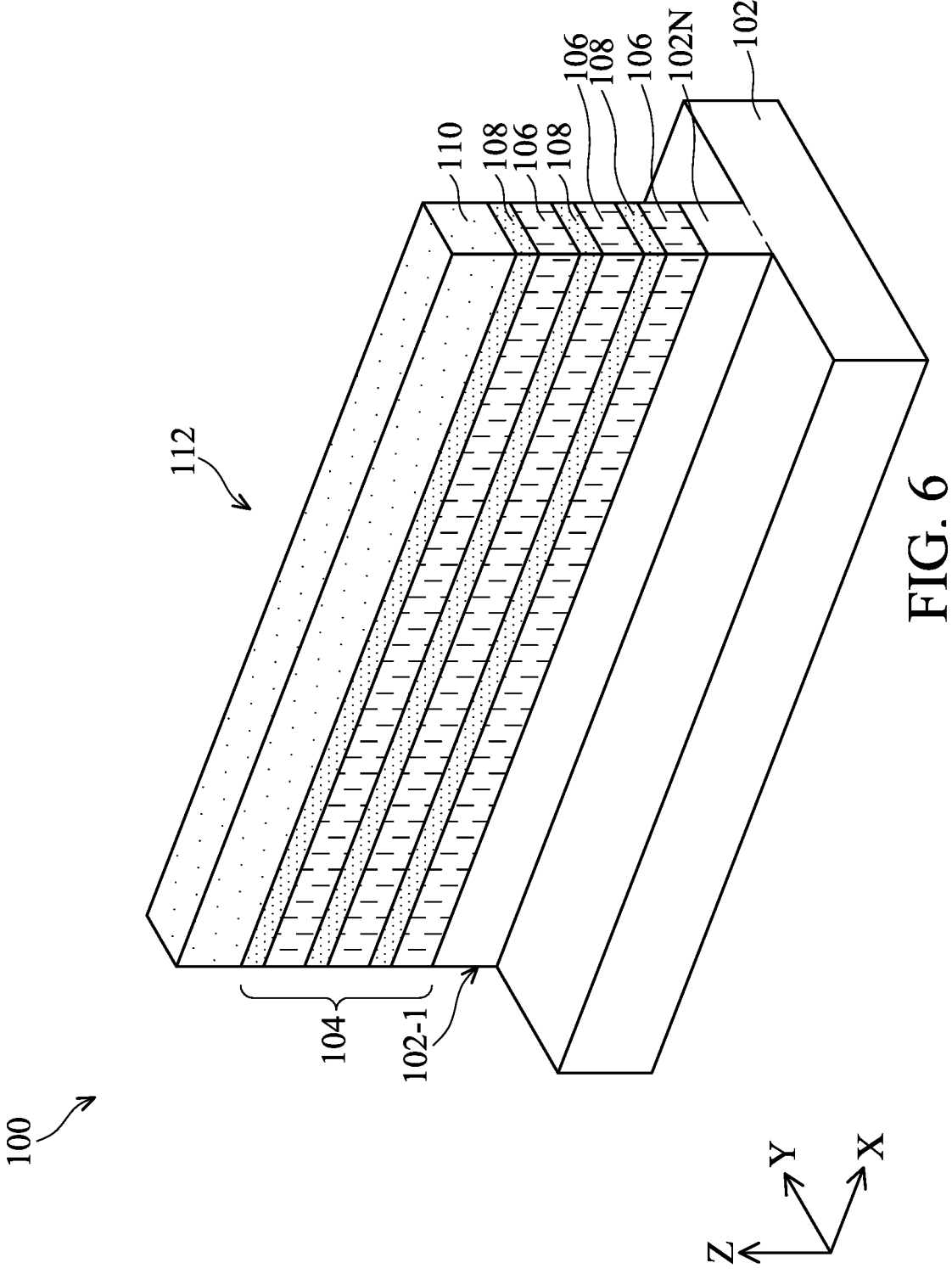

Referring to FIG. 6, the substrate 102 and the stack 104 are then patterned to form a fin 112 over the substrate 102. For patterning purposes, the workpiece 100 may also include a hard mask layer 110 over the stack 104 before the patterning of the substrate 102 and the stack 104. The hard mask layer 110 may be a single layer or a multi-layer. In some embodiments, the hard mask layer 110 is a single layer and includes a silicon germanium layer. In some embodiments, the hard mask layer 110 is a multi-layer and includes a silicon nitride layer and a silicon oxide layer over the silicon nitride layer. In some other embodiments, the hard mask layer 110 is a multi-layer and includes a silicon germanium layer and a silicon layer over the silicon germanium layer.

As shown in FIG. 6, the fin 112 includes a base fin 102-1 formed from a portion of the substrate 102 and a stack portion formed from the stack 104 over the base portion. In some aspects, the base fin 102-1 protrudes from the substrate 102. The fin 112 may include the semiconductor layers 106 and 108 alternating stacked in the Z-direction. The fin 112 extends lengthwise (e.g., longitudinally) in the X-direction, as shown in FIG. 6. Although one fin 112 is formed and shown herein, more fins may be formed, such as two or more fins.

The fins 112 may be patterned using suitable processes including double-patterning or multi-patterning processes. For example, in some embodiments, a material layer of the hard mask layer 110 is formed over the substrate 102 and patterned into the hard mask layer 110 using a photolithography process. One or more etching processes are then performed to etch the stack 104 and top portions of the substrate 102 not covered by the hard mask layer 110 to form the fin 112. The etching process may include dry etching, wet etching, reactive ion etching (RIE), and/or other suitable processes.

Figure 7:
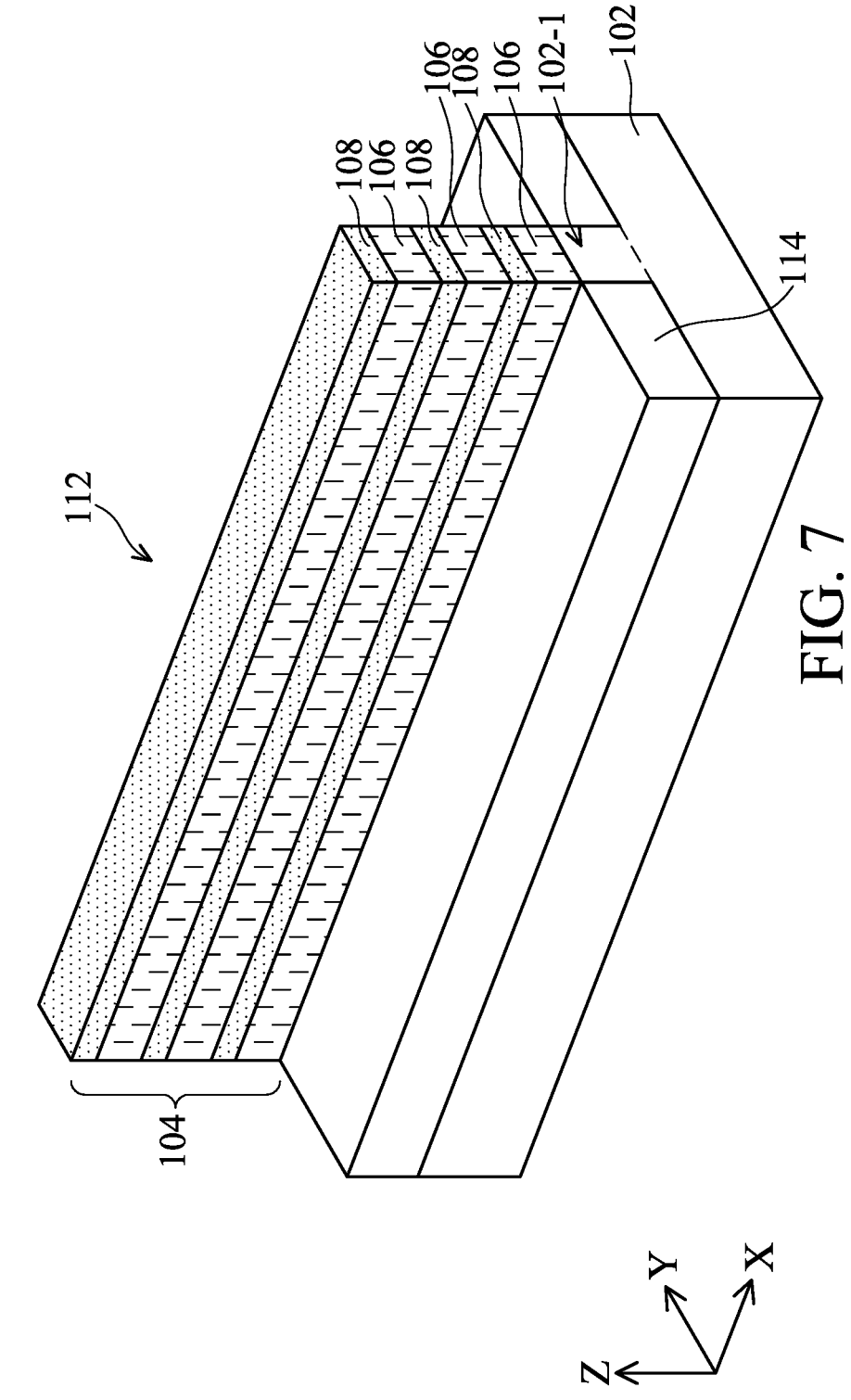

Referring to FIG. 7, isolation feature 114 is formed over the substrate 102. More specifically, after the fin 112 is formed, the hard mask layer 110 over the fin 112 is removed and the isolation feature 114 is then formed over the substrate 102. In some aspects, the isolation feature 114 is formed around the fin 112. The isolation features 114 may be shallow trench isolation (STI) features that provide electrical isolation between the different GAA transistors, in accordance with some embodiments. As such, the isolation feature 114 may also be referred to as STI feature.

In some embodiments, a dielectric material for the isolation feature 114 is first deposited over the workpiece 100. Specifically, the dielectric material is deposited and formed over the fin 112 and the substrate 102 to cover the fin 112 and the substrate 102. In some aspects, the dielectric material is formed to wrap around the fin 112. In some embodiments, the dielectric material may include silicon oxide, silicon nitride, silicon oxynitride, silicon carbide, borosilicate glass (BSG), phosphoric silicate glass (PSG), borophosphosilicate glass (BPSG), fluorine-doped silicate glass (FSG), a low-k dielectric (e.g., a carbon doped oxide, SiCOH), combinations thereof, and/or other suitable materials. In various embodiments, the dielectric material may be deposited by a CVD, a subatmospheric CVD (SACVD), a plasma-enhanced CVD (PECVD), a flowable CVD (FCVD), an ALD, a plasma-enhanced ALD (PEALD), spin-on coating, and/or other suitable process. The deposited dielectric material is then thinned and planarized, for example by a chemical mechanical polishing (CMP) process. The planarized dielectric material is further recessed by a dry etching process, a wet etching process, and/or a combination thereof to form the isolation feature 114.

In some embodiments, the isolation feature 114 may have a multi-layer structure such as a thermal oxide liner layer over the substrate 102 and a filling layer (e.g., silicon nitride or silicon oxide) over the thermal oxide liner layer. In some embodiments, before the formation of the isolation feature 114, a liner layer may be conformally deposited over the substrate 102 using ALD or CVD. Furthermore, as shown in FIG. 7, the stack portion of the fin 112 rise above the isolation feature 114 while the base fin 102-1 are surrounded by the isolation feature 114. In other words, a top surface (or a topmost surface) of the substrate 102 is higher than top surfaces of the isolation feature 114. In some embodiments, before the formation of the isolation feature 114, a liner layer may be conformally deposited over the substrate 102 using ALD or CVD.

Figure 8:
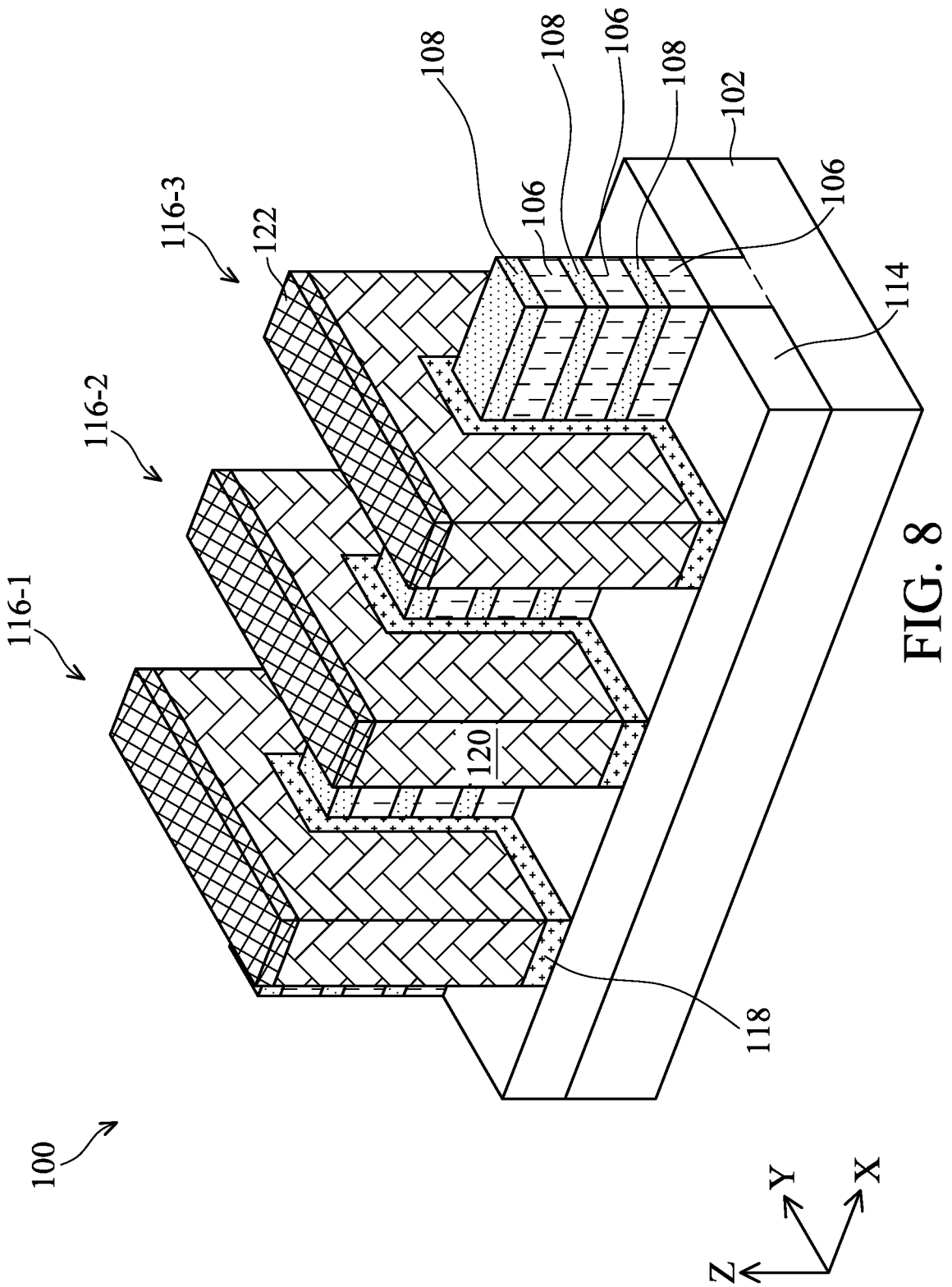

Referring to FIG. 8, dummy gate structures 116-1 to 116-3 (may be collectively referred to as dummy gate structures 116) may be formed over the fin 112, the isolation feature 114, and the substrate 102. The dummy gate structure 116 may be configured to extend lengthwise in the Y-direction and wrap around a top surface and side surfaces of the fin 112, as shown in FIG. 8. In some embodiments, to form the dummy gate structures 116, a dummy interfacial material of a dummy interfacial layer 118 is first formed over fin 112 and over the isolation feature 114. In some embodiments, the dummy interfacial layer 118 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material of a dummy gate electrode 120 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., PVD, CVD, PECVD, and ALD).

Then, hard mask layers 122 are formed over the dummy gate material. In some embodiments, the hard mask layers 122 may be formed using photolithography and removal (e.g., etching) processes. In some embodiments, the hard mask layers 122 may include photoresist materials or hard mask materials. In some embodiments, each of the hard mask layers 122 may include multiple layers, such as a silicon nitride layer and a silicon oxide layer. After the formation of the hard mask layers 122, a removal process (e.g., etching) may be performed to remove portions of the dummy gate material for the dummy gate electrodes 120 and the dummy interfacial material for the dummy interfacial layers 118 that do not directly underlie the hard mask layers 122, thereby forming the dummy gate structures 116 each having the dummy interfacial layer 118, the dummy gate electrode 120, and the hard mask layer 122. The dummy interfacial layers 118 may also be referred to as dummy gate dielectrics. The dummy gate structures 116 may undergo a gate replacement process through subsequent processing to form metal gates, such as a high-k metal gate, as discussed in greater detail below.

FIG. 8 shows three dummy gate structures 116-1 to 116-3. In some embodiments, less or more dummy gate structures may be formed for one or more transistors sharing source/drain regions. In other embodiments, some dummy gate structures may also undergo a gate replacement process to form dielectric based gates that electrically isolate transistors formed by the dummy gate structure 116 from neighboring transistors or devices. For examples, dummy gate structures 116-1 and 116-3 may be replaced with dielectric material in sequent processes to form dielectric based gates to isolate resultant transistor formed from the dummy gate structure 116-2 from neighboring transistors or devices.

Figure 9:
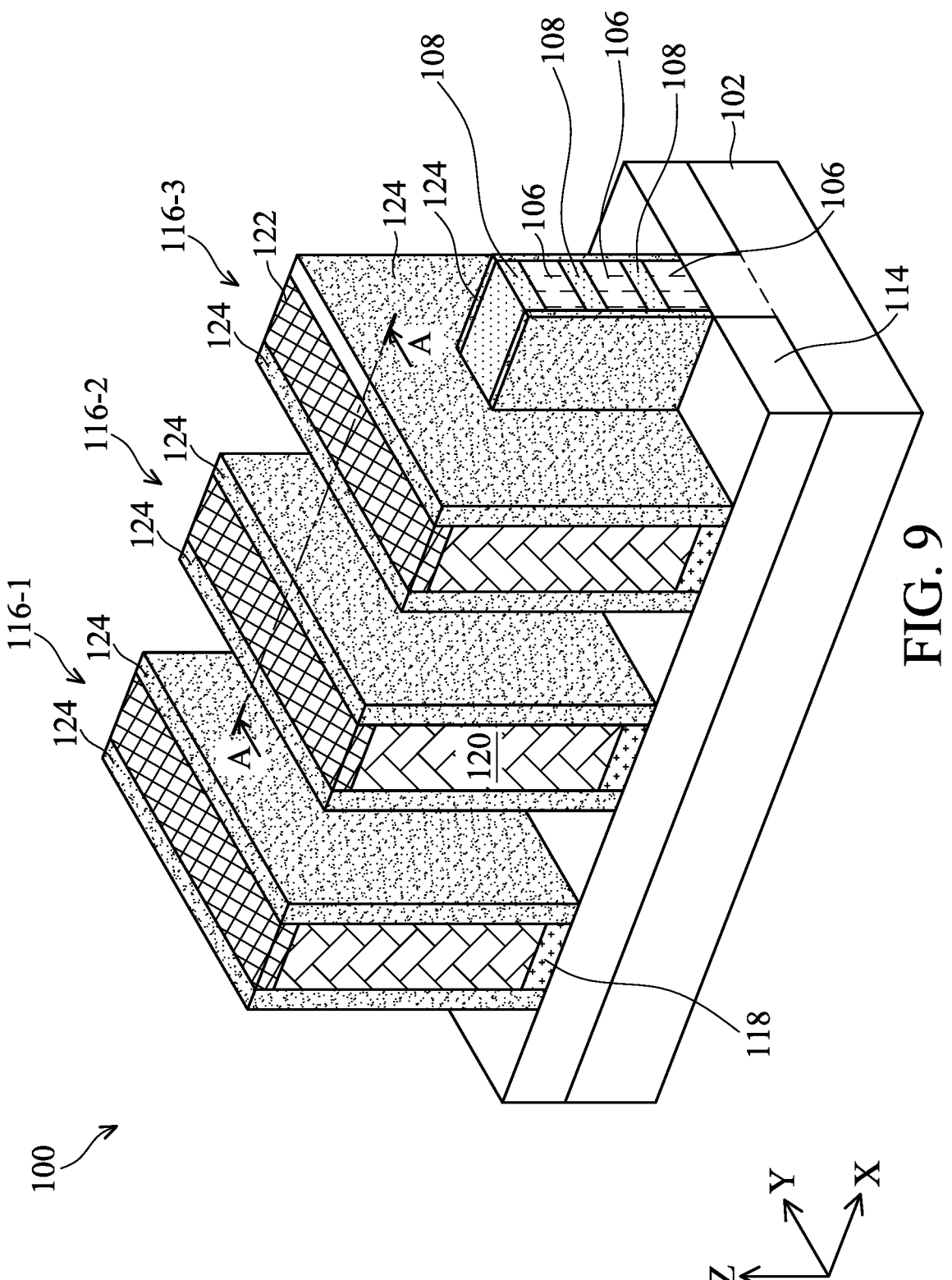

Referring to FIG. 9, after the formation of the dummy gate structures 116, gate spacers 124 are formed on the sidewalls of the dummy gate structures 116, over a top surface of the fin 112, and on sidewalls of the fin 112. More specifically, the gate spacers 124 are formed on opposite sidewalls of the fin 112 and formed on opposite sidewalls of the dummy gate structures 116, as shown in FIG. 9. The gate spacers 124 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 124 may include a single layer or a multi-layer structure. In some embodiments, the gate spacers 124 may be formed by conformally depositing a spacer layer (containing the dielectric material) over the isolation feature 114, the fin 112, and dummy gate structures 116, followed by an anisotropic etching process to remove top portions of the spacer layer from the top surfaces of the isolation feature 114, the fin 112, and dummy gate structures 116. After the etching process, portions of the spacer layer on the sidewall surfaces of the fin 112 and the dummy gate structures 116 substantially remain and become the gate spacers 124. In some embodiments, the anisotropic etching process is a dry (e.g., plasma) etching process. Additionally or alternatively, the formation of the gate spacers 124 may also involve chemical oxidation, thermal oxidation, ALD, CVD, and/or other suitable methods. The gate spacers 124 may also be interchangeably referred to as the top spacers.

Figure 10:
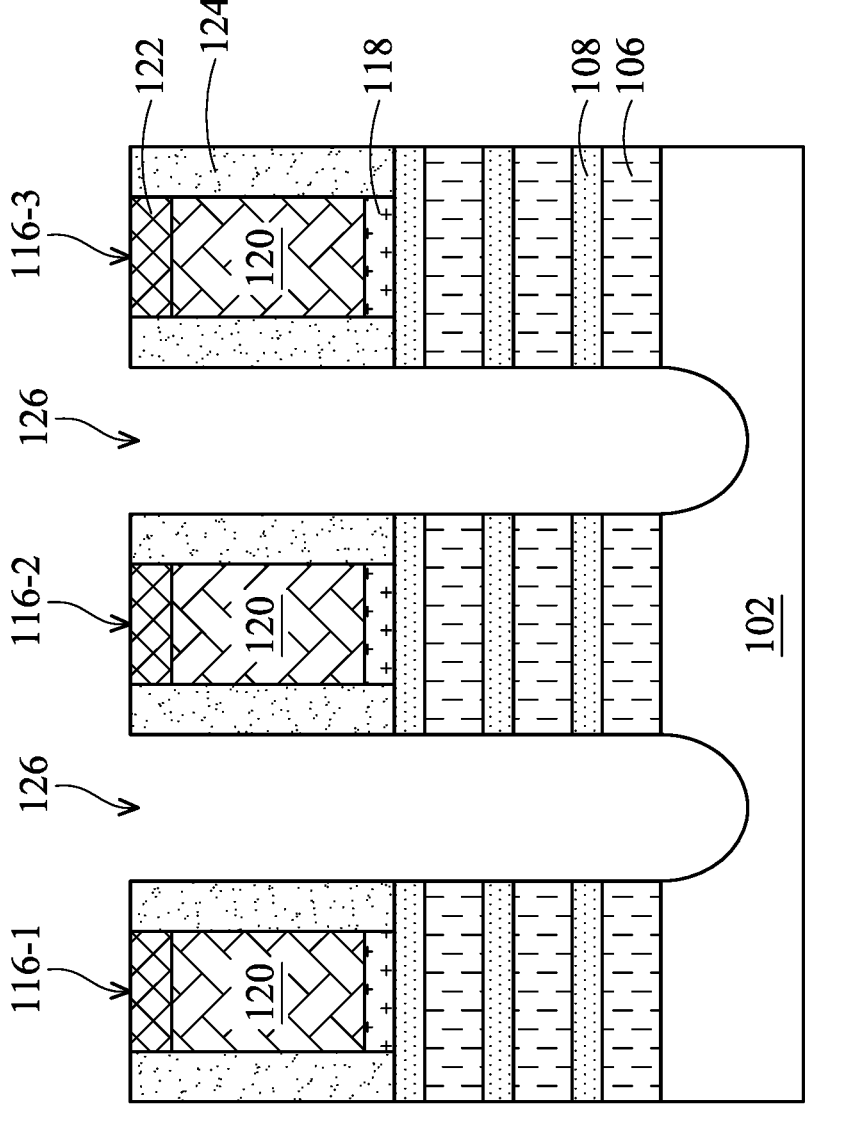
Figure 10:
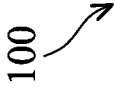
Figure 10:
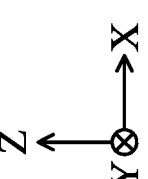

Referring to FIG. 10, the fin 112 is recessed to form source/drain trenches 126 in the fin 112 (or passing through the semiconductor layers 106 and 108) exposed by the dummy gate structures 116. More specifically, the source/drain trenches 126 may be formed by performing one or more etching processes to remove portions of the semiconductor layers 106, the semiconductor layers 108, and the substrate 102 that do not vertically overlap or be covered by the dummy gate structures 116 and gate spacers 124. In some embodiments, a single etchant may be used to remove the semiconductor layers 106, the semiconductor layers 108, and the substrate 102, whereas in other embodiments, multiple etchants may be used to perform the etching process. As shown in FIG. 10, portions of the substrate 102 are etched so that the source/drain trenches 126 each has a concave surface in the substrate 102, and the concave surface is lower than the top surfaces of the isolation feature 114 (not shown in FIG. 10).

Figure 11:
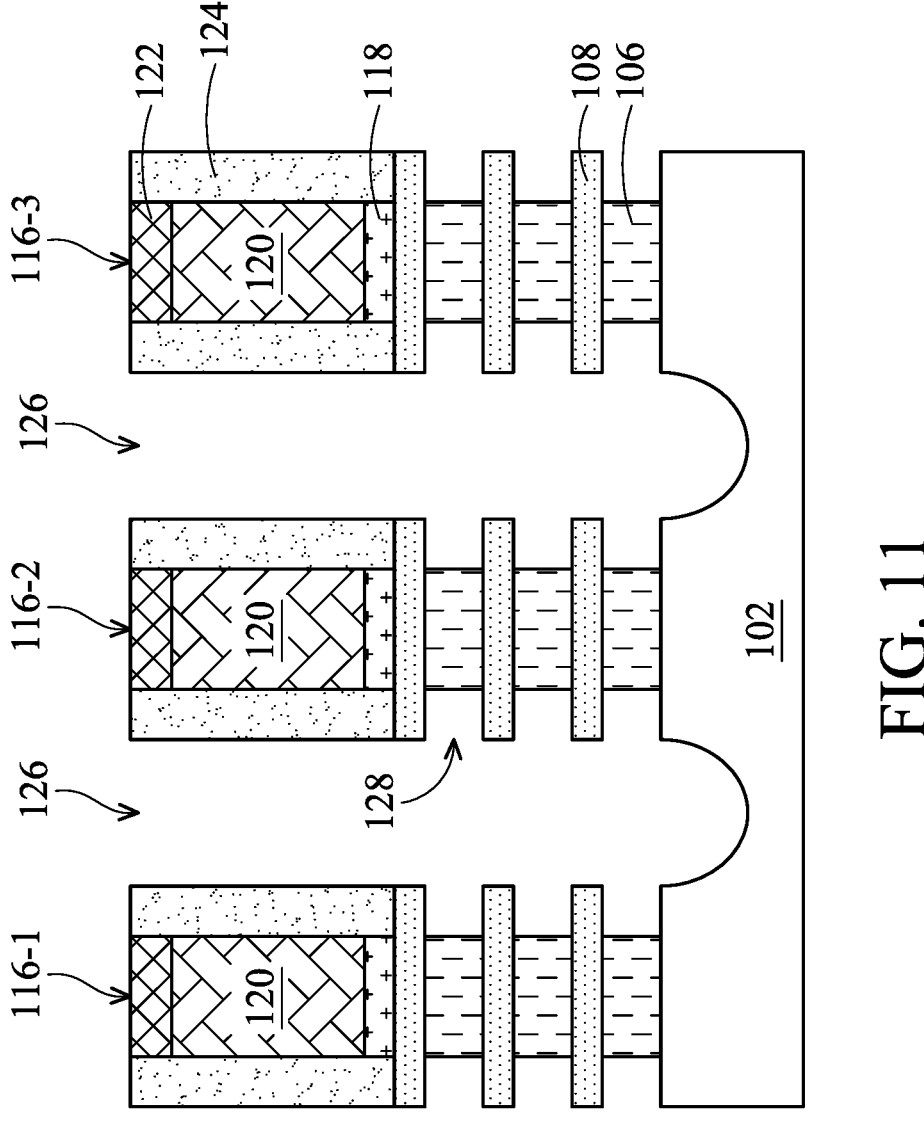
Figure 11:
Figure 11:
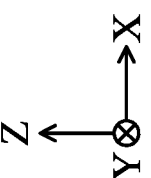

Referring to FIG. 11, side portions of the semiconductor layers 106 are removed via a selective etching process. More specifically, the selective etching process is performed that selectively etches the side portions of the semiconductor layers 106 below the gate spacers 124 through the source/drain trenches 126, with minimal (or no) etching of semiconductor layers 108, the gate spacers 124, and the substrate 102, such that gaps 128 are formed between (the side portions of) the semiconductor layers 108 in the Z-direction as well as between (the side portions of) the semiconductor layers 108 and the substrate 102 the Z-direction, below the gate spacers 124. The etching process is configured to laterally etch (e.g., along the X-direction) the semiconductor layers 106 below the gate spacers 124. The selective etching process is a dry etching process, a wet etching process, other suitable etching process, or combinations thereof.

Figure 12:
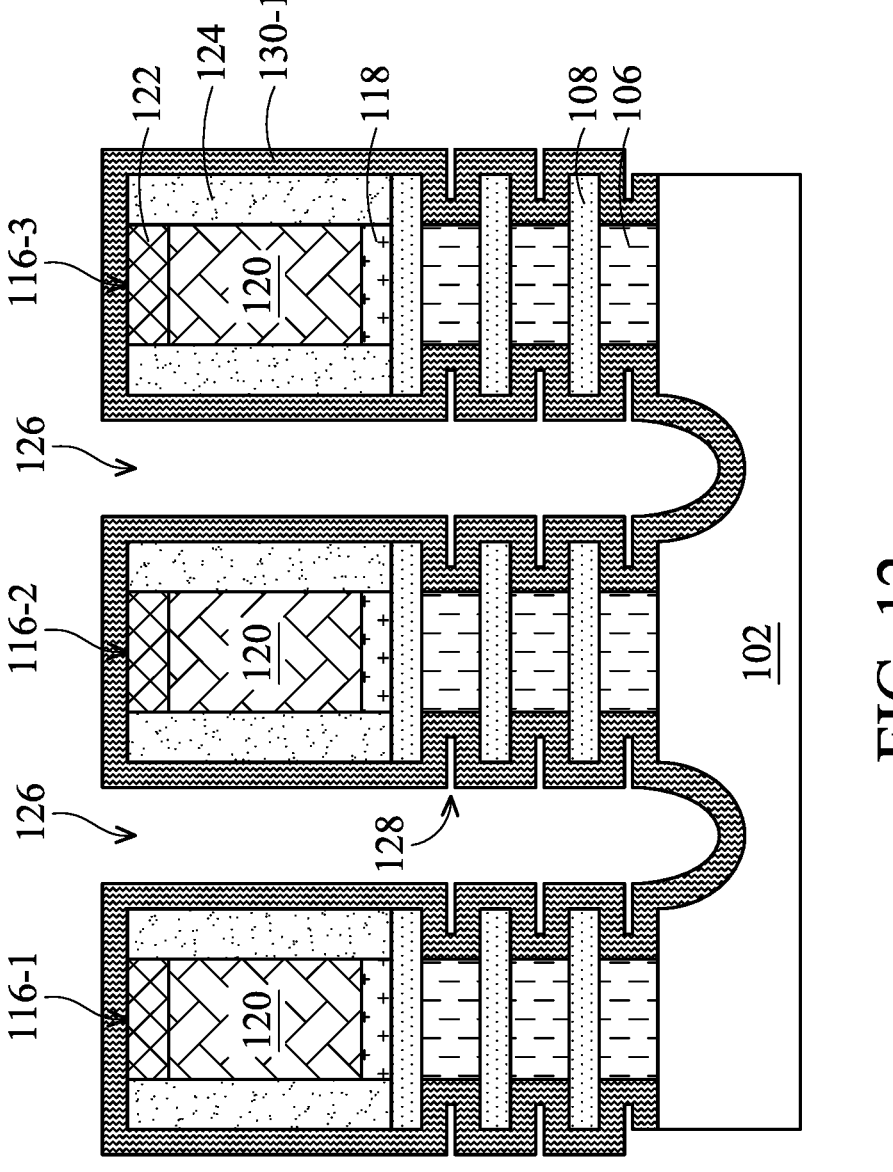
Figure 12:
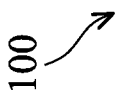
Figure 12:
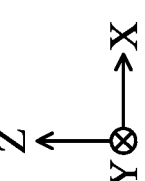

FIGS. 12 to 18 shows the formation of inner spacers 138. Referring to FIG. 12, a liner material 130-1 is conformally formed into the source/drain trenches 126 and the gaps 128. In some embodiments, a deposition process is performed to form the liner material 130-1 into the source/drain trenches 126 and the gaps 128, such as CVD, PVD, ALD, HDPCVD, MOCVD, RPCVD, PECVD, LPCVD, ALCVD, APCVD, other suitable methods, or combinations thereof. The liner material 130-1 partially fills the source/drain trenches 126 and partially fills the gaps 128, as shown in FIG. 12. More specifically, as shown in FIG. 12, the liner material 130-1 is conformally formed on top surfaces of the dummy gate structures 116 (specifically, top surfaces of the hard mask layer 122) and the substrate 102 (exposed in the source/drain trenches 126), on sidewalls of the gate spacers 124, the semiconductor layers 106, and the semiconductor layers 108. Furthermore, the liner material 130-1 is also conformally formed on top surfaces and bottom surfaces of the semiconductor layers 108 exposed in the gaps 128. The deposition process is configured to ensure that the liner material 130-1 partially fills the gaps 128 between (the side portions of) the semiconductor layers 108 as well as between (the side portions of) the (bottommost) semiconductor layers 108 and the substrate 102 direct under the gate spacers 124.

The liner material 130-1 includes a material that is different than a material of the semiconductor layers 108 and a material of the gate spacers 124 to achieve desired etching selectivity during the etching process. In some embodiments, the liner material 130-1 include a dielectric material that includes silicon, oxygen, carbon, nitrogen, other suitable material, or combinations thereof (for example, silicon oxide ($SiO_x$), silicon oxynitride (SiON), silicon oxycarbide (SiOC), silicon carbon nitride (SiCN), silicon oxycarbon nitride (SiOCN)).

Figure 13:
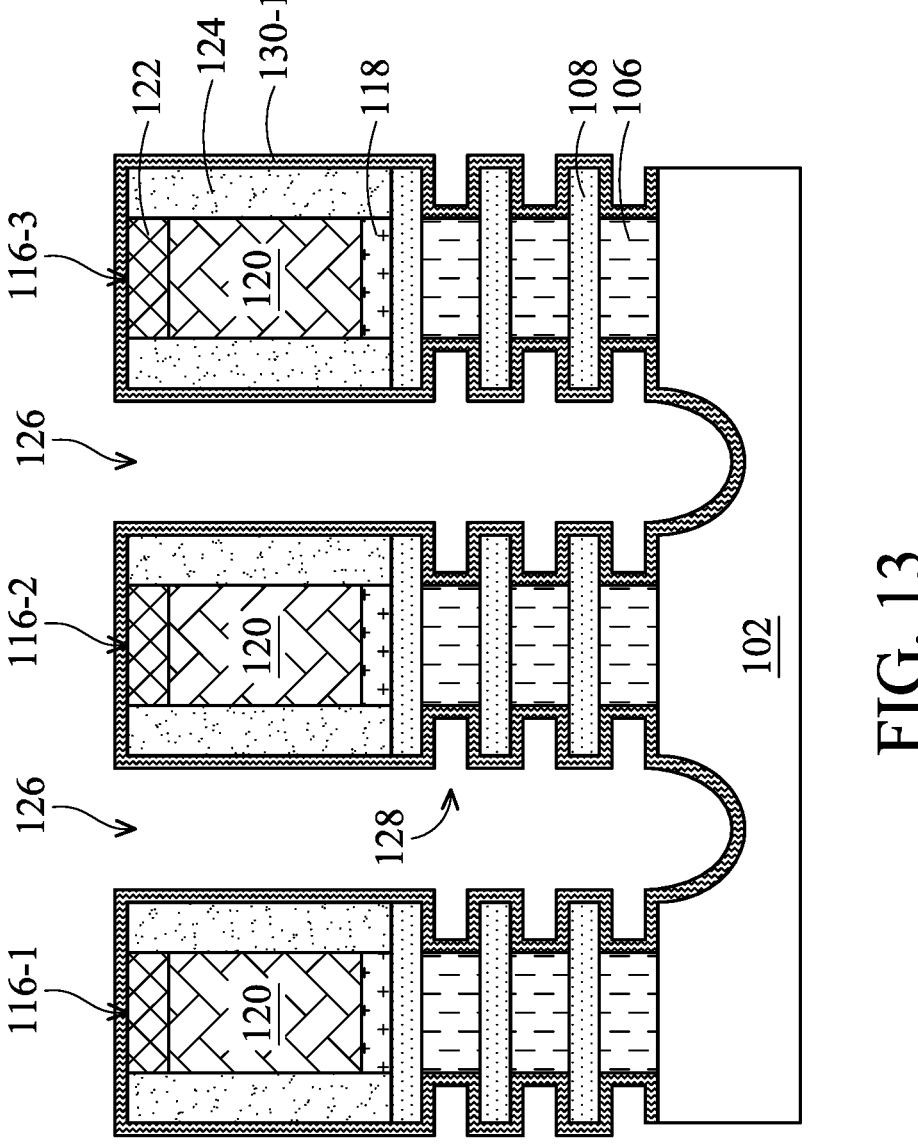
Figure 13:
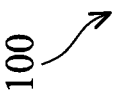
Figure 13:
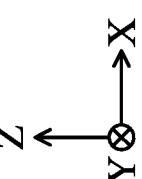

Referring to FIG. 13, after the formation of the liner material 130-1, the liner material 130-1 is trimmed to reduce the thickness of the liner material 130-1. More specifically, one or more etching processes are performed to partially etch the liner material 130-1 to trim the liner material 130-1 to partially remove the liner material 130-1. Therefore, the thickness of the liner material 130-1 is reduced until the thickness of the liner material 130-1 reach the desired thickness. The one or more etching processes are isotropic etching processes, such as wet etching process, to uniformly reduce the thickness of the liner material 130-1 to the desired thickness without exposing other features, in accordance with some embodiments. After the one or more etching processes, the spaces in the gaps 128 are enlarged, as shown in FIG. 13.

Figure 14:
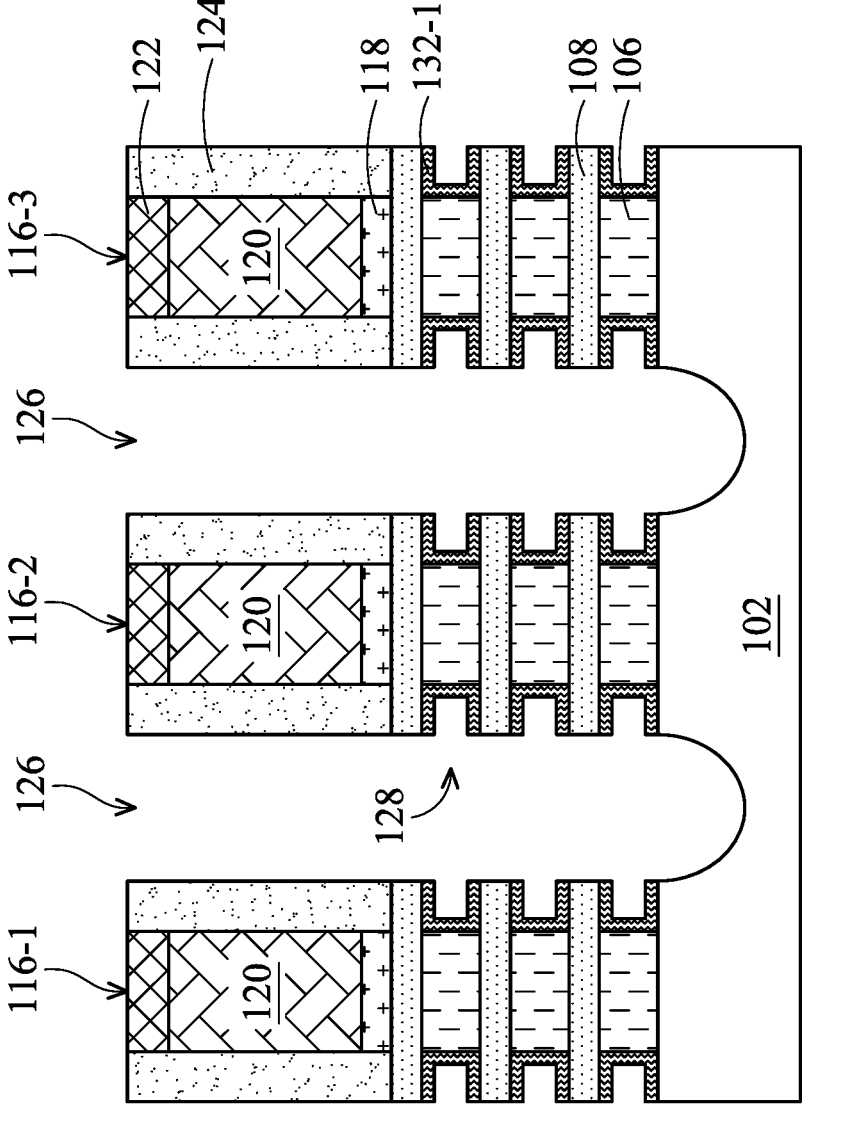
Figure 14:
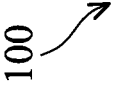
Figure 14:
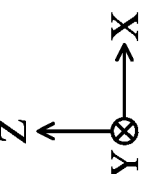

Referring to FIG. 14, after the trimming of the liner material 130-1, portions of the liner material 130-1 are removed to form liner layers 132-1. More specifically, an etching process is performed to remove the portions of the liner material 130-1 on top surfaces of the dummy gate structures 116 (specifically, the top surfaces of the hard mask layer 122) and the substrate 102 (exposed in the source/drain trenches 126), on the sidewalls of the gate spacers 124 and the semiconductor layers 108. The etching process is also a selective etching process that selectively etches the portions of the liner material 130-1 above, with minimal (or no) etching of the dummy gate structures 116 (specifically, the hard mask layer 122), the substrate 102, the gate spacers 124, and the semiconductor layers 108.

As such, the liner material 130-1 in the gaps 128 remain, in accordance with some embodiments. More specifically, the liner material 130-1 on the sidewalls of the semiconductor layers 106 and on the top surfaces and the bottom surfaces of the semiconductor layers 108 exposed in the gaps 128 remain, as shown in FIG. 14. Therefore, the remaining liner material 130-1 become and is referred to as the liner layers 132-1. In some embodiments, the etching process is also an anisotropic etching process, such as dry etching process, such that the liner material 130-1 in the gaps 128 covered by the gate spacers 124 remains to form the liner layers 132-1. The liner layers 132-1 partially fill the gaps 128.

Figure 15:
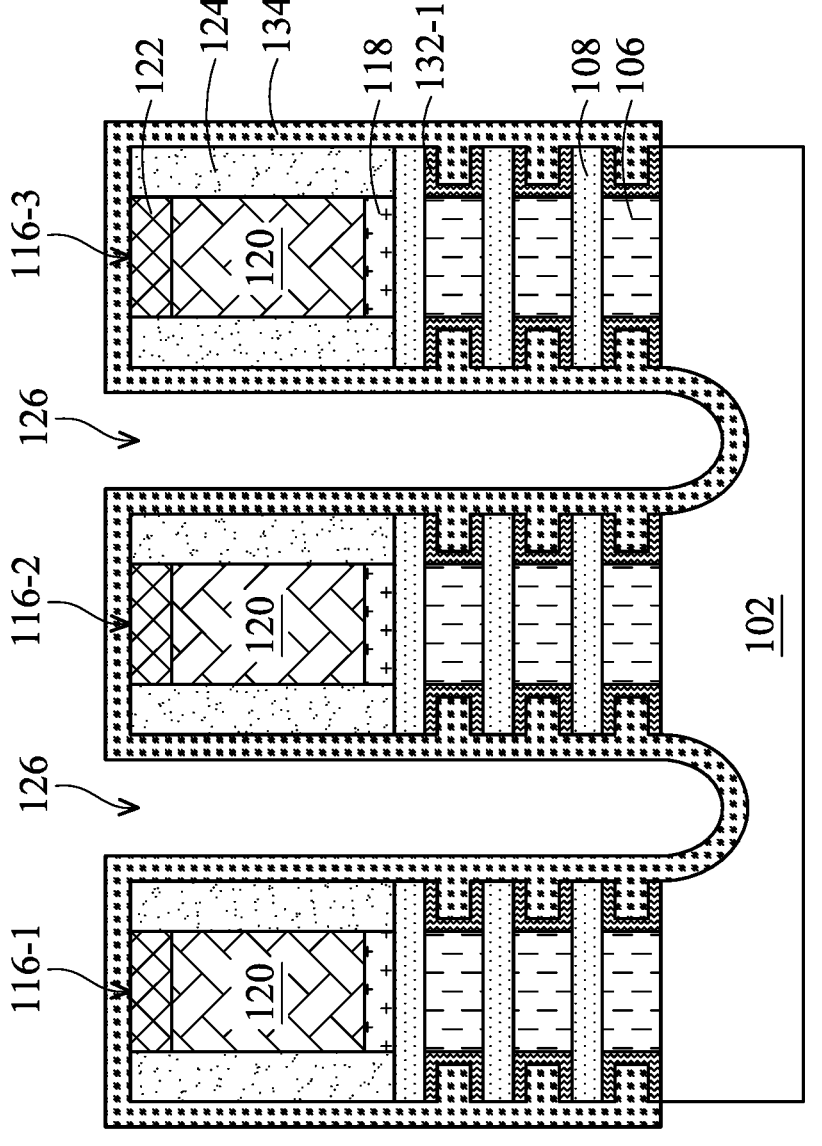
Figure 15:
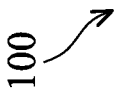
Figure 15:
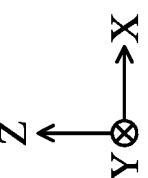

Referring to FIG. 15, a core material 134 is conformally formed into the source/drain trenches 126 and the gaps 128.

In some embodiments, a deposition process is performed to form the core material 134 into the source/drain trenches 126 and the gaps 128, such as CVD, PVD, ALD, HDPCVD, MOCVD, RPCVD, PECVD, LPCVD, ALCVD, APCVD, other suitable methods, or combinations thereof. The core material 134 partially fills the source/drain trenches 126 and fully fills the gaps 128, as shown in FIG. 15. More specifically, as shown in FIG. 15, the core material 134 is conformally formed on the top surfaces of the dummy gate structures 116 (specifically, top surfaces of the hard mask layer 122) and the substrate 102 (exposed in the source/drain trenches 126), on the sidewalls of the gate spacers 124, the semiconductor layers 106, and the liner layers 132-1. Furthermore, the core material 134 is also conformally formed on top surfaces and bottom surfaces of the liner layers 132-1 exposed in the gaps 128. The deposition process is configured to ensure that the core material 134 fully fills the gaps 128 between (the side portions of) the semiconductor layers 108 as well as between (the side portions of) the (bottommost) semiconductor layers 108 and the substrate 102 direct under the gate spacers 124.

The core material 134 includes a material that is different than a material of the liner layers 132-1 (i.e., the liner material 130-1), a material of the semiconductor layers 108, and a material of the gate spacers 124 to achieve desired etching selectivity during the etching process. In some embodiments, the core material 134 include a dielectric material that includes low-k oxides, amorphous carbon, polymers, and the like.

Figure 16:
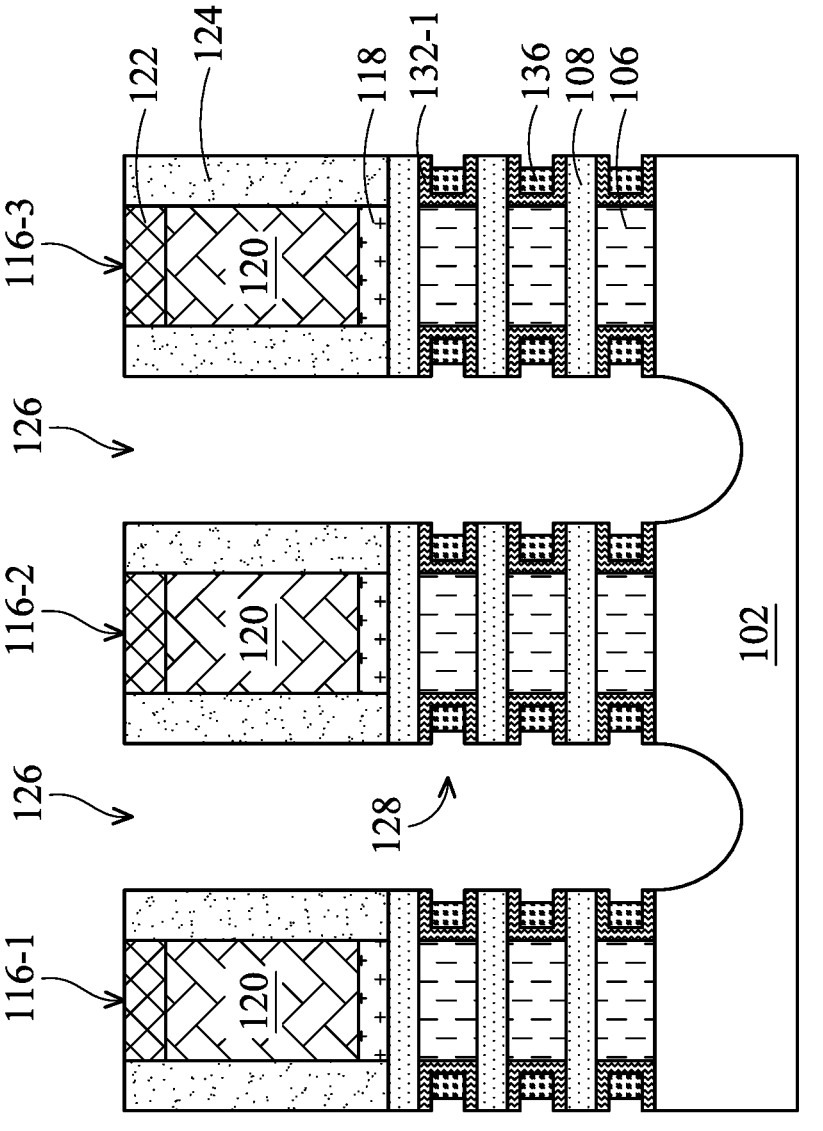
Figure 16:

Referring to FIG. 16, after the formation of the core material 134, portions of the core material 134 is removed to form core layers 136. More specifically, an etching process is performed to remove the portions of the core material 134 on the top surfaces of the dummy gate structures 116 (specifically, the top surfaces of the hard mask layer 122) and the substrate 102 (exposed in the source/drain trenches 126), on the sidewalls of the gate spacers 124 and the semiconductor layers 108. The etching process is also a selective etching process that selectively etches the portions of the core material 134 above, with minimal (or no) etching of the dummy gate structures 116 (specifically, the hard mask layer 122), the substrate 102, the gate spacers 124, and the semiconductor layers 108.

Furthermore, the core material 134 in the gaps 128 is also partially removed. In some embodiments, the etching process is also an isotropic etching process, such as wet etching process. More specifically, the etching process is also configured to laterally etch (e.g., along the X-direction) the core material 134 to partially remove portions of the core material 134 exposed in the gaps 128, as shown in FIG. 16. As such, other portions of the core material 134 in the gaps 128 remain, in accordance with some embodiments. Therefore, the remaining core material 134 in the gaps 128 become and is referred to as the core layers 136. The core layers 136 partially fill the spaces in the gaps 128 and the liner layers 132-1.

Figure 17:
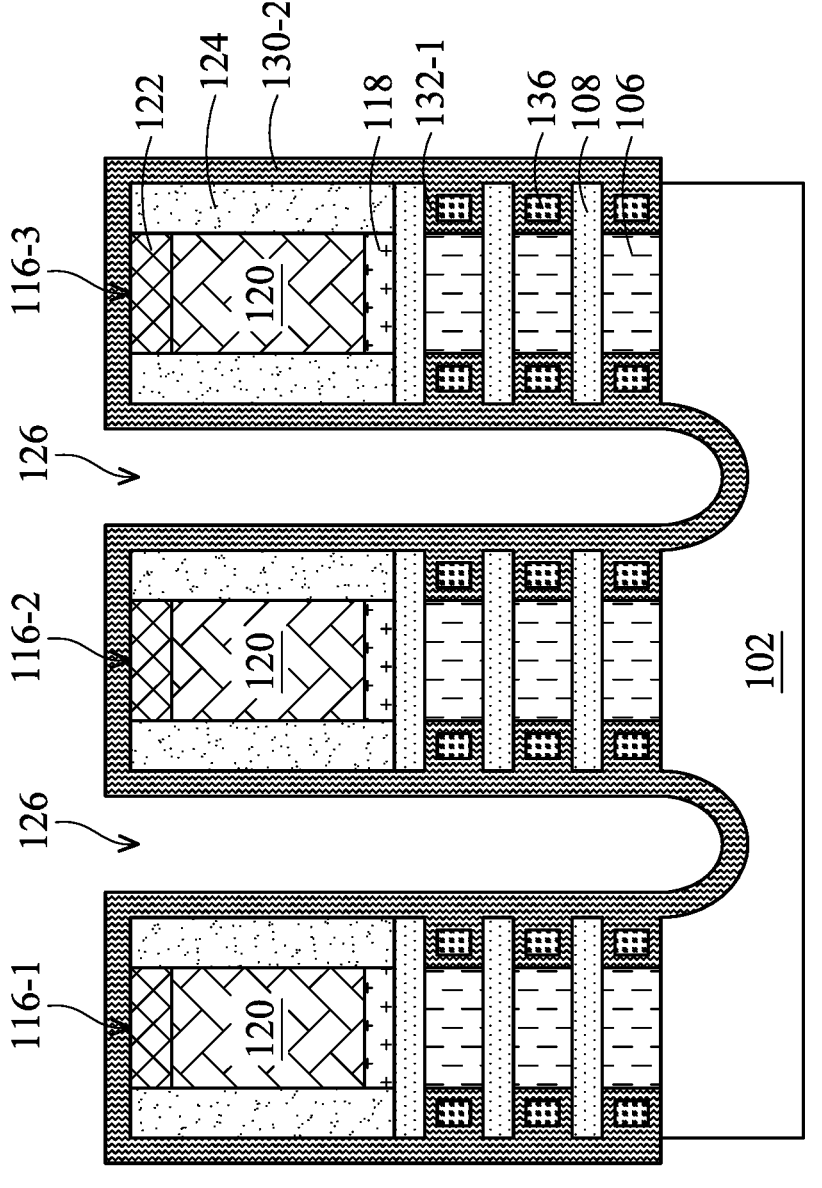
Figure 17:
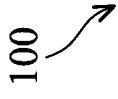
Figure 17:
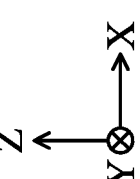

Referring to FIG. 17, a liner material 130-2 is conformally formed into the source/drain trenches 126 and the gaps 128. In some embodiments, a deposition process is performed to form the liner material 130-2 into the source/drain trenches 126 and the gaps 128, such as CVD, PVD, ALD, HDPCVD, MOCVD, RPCVD, PECVD, LPCVD, ALCVD, APCVD, other suitable methods, or combinations thereof. The liner material 130-2 partially fills the source/drain trenches 126 and fully fills the gaps 128, as shown in FIG. 17. More specifically, as shown in FIG. 17, the liner material 130-2 is conformally formed on the top surfaces of the dummy gate structures 116 (specifically, the top surfaces of the hard mask layer 122) and the substrate 102 (exposed in the source/drain trenches 126), on the sidewalls of the gate spacers 124, the semiconductor layers 106, and the core layers 136. Furthermore, the liner material 130-2 is also conformally formed on the top surfaces and the bottom surfaces of the liner layers 132-1 exposed in the gaps 128. The deposition process is configured to ensure that the liner material 130-2 fully fills the gaps 128 between (the side portions of) the semiconductor layers 108 as well as between (the side portions of) the (bottommost) semiconductor layers 108 and the substrate 102 direct under the gate spacers 124.

The liner material 130-2 includes a material that is different than a material of the semiconductor layers 108 and a material of the gate spacers 124 to achieve desired etching selectivity during the etching process. In some embodiments, the liner material 130-1 and 130-2 have the same material. The liner material 130-1 and 130-2 may be collectively referred to as liner material 130. Therefore, the liner material 130-2 also include a dielectric material that includes silicon, oxygen, carbon, nitrogen, other suitable material, or combinations thereof (for example, silicon oxide ($SiO_x$), silicon oxynitride (SiON), silicon oxycarbide (SiOC), silicon carbon nitride (SiCN), silicon oxycarbon nitride (SiOCN)), as the discussed above.

Figure 18:
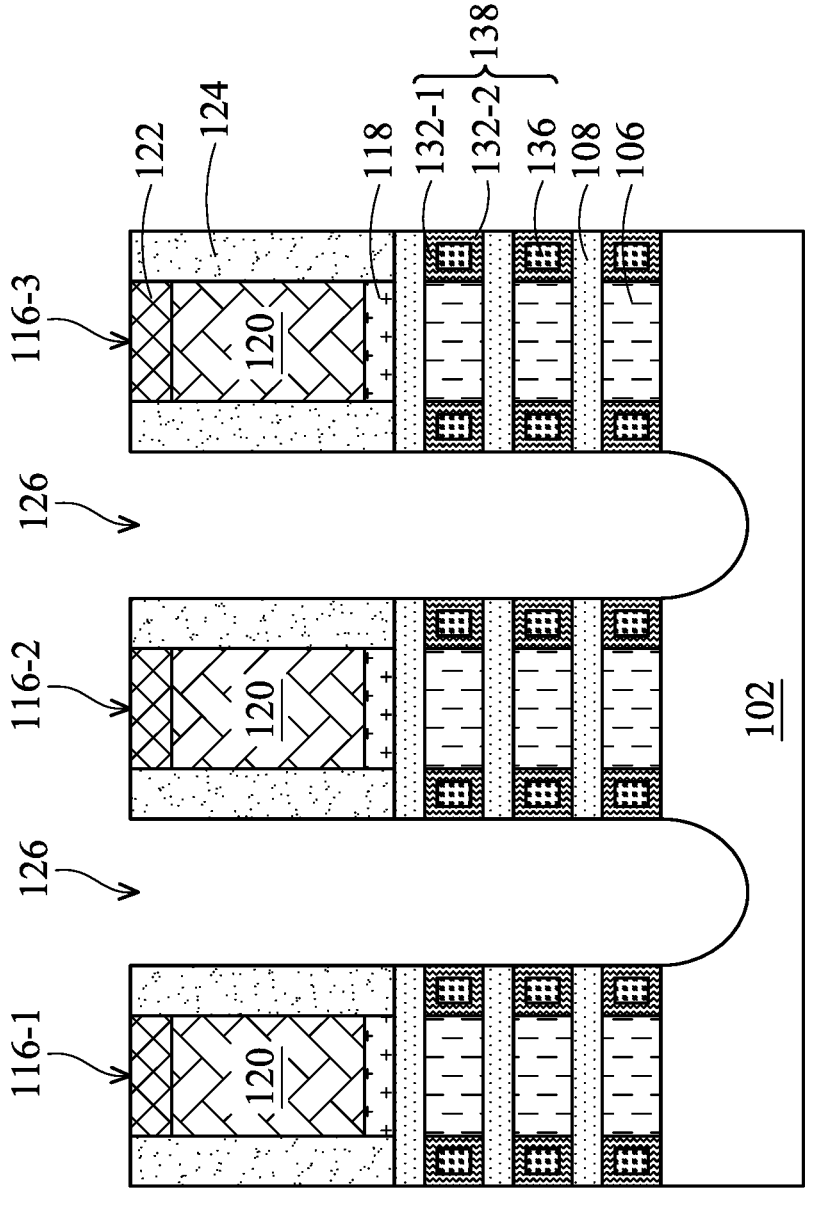

Referring to FIG. 18, after the formation of the liner material 130-2, portions of the liner material 130-2 are removed to form liner layers 132-2. More specifically, an etching process is performed to remove the portions of the liner material 130-2 on top surfaces of the dummy gate structures 116 (specifically, the top surfaces of the hard mask layer 122) and the substrate 102 (exposed in the source/drain trenches 126), on the sidewalls of the gate spacers 124 and the semiconductor layers 108. The etching process is also a selective etching process that selectively etches the portions of the liner material 130-2 above, with minimal (or no) etching of the dummy gate structures 116 (specifically, the hard mask layer 122), the substrate 102, the gate spacers 124, and the semiconductor layers 108.

As such, the liner material 130-2 in the gaps 128 remain, in accordance with some embodiments. More specifically, the liner material 130-2 on the sidewalls of the core layers 136 and on the top surfaces and the bottom surfaces of the liner material 130-1 exposed in the gaps 128 remain, as shown in FIG. 18. Therefore, the remaining liner material 130-2 become and is referred to as the liner layers 132-2. In some embodiments, the etching process is also an anisotropic etching process, such as dry etching process, such that the liner material 130-2 in the gaps 128 covered by the gate spacers 124 remains to form the liner layers 132-2.

The liner layers 132-1 and the liner layers 132-2 may be collectively referred to as liner layers 132. The liner layers 132 and the core layers 136 together serve as the inner spacers 138 (i.e., the liner layers 132 and the core layers 136 may be collectively referred to as the inner spacers 138). The inner spacers 138 are disposed between (the side portions of) the semiconductor layers 108 in the Z-direction as well as between (the side portions of) the (bottommost) semiconductor layers 108 and the substrate 102 direct under the gate spacers 124 in the Z-direction.

As shown in FIG. 18, the liner layers 132 wrap around the core layers 136, in accordance with some embodiments. In some embodiments, the liner layers 132 are harder than the core layers 136 (or the core layers 136 are softer than the liner layers 132). Therefore, the liner layers 132 may be referred to as hard liner layers and the core layers 136 may be referred to as soft core layers. Furthermore, a Young's modulus of the liner layers 132 is greater than a Young's modulus of the core layers 136. More specifically, the Young's modulus of the core layers 136 is less than 0.8 times of the Young's modulus of the liner layers 132. Therefore, the influence of the inner spacers 138 with the core layers 136 wrapped around by the liner layers 132 to the stress from source/drain features to the nanostructures in the GAA transistors is reduced, as discussed in greater detail below.

Figure 19:
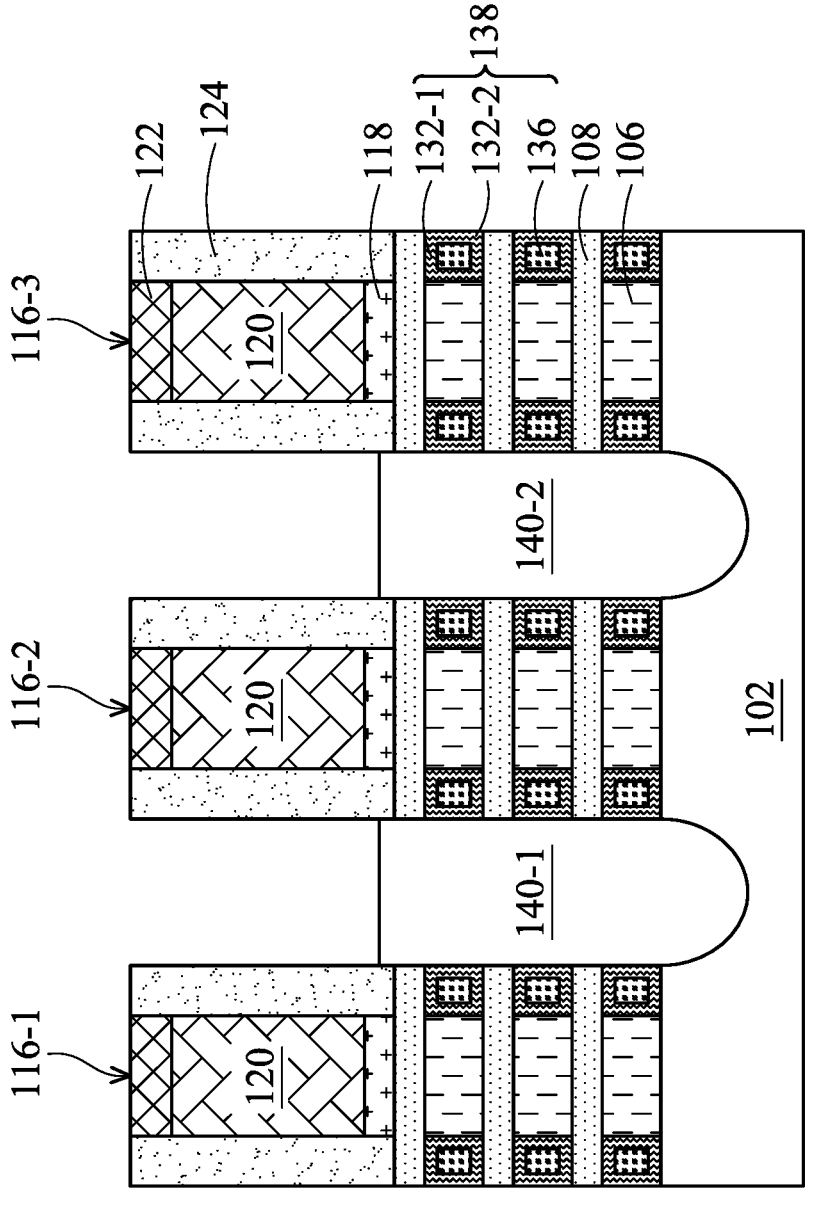
Figure 19:
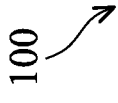
Figure 19:
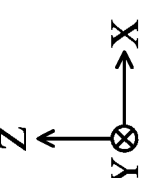

Referring to FIG. 19, source/drain features 140-1 and 140-2 (may be collectively referred to as source/drain features 140) are formed in the source/drain trenches 126 and over the substrate 102, so that the source/drain features 140-1 and 140-2 pass through the semiconductor layers 108 and are in the fin 112. The source/drain features are also formed on opposite sides of the dummy gate structures 116 in the X-direction. For example, the source/drain features 140-1 and 140-2 are formed on opposite sides of the dummy gate structure 116-2 in the X-direction, as shown in FIG. 19. Furthermore, the source/drain features 140 are disposed on opposite sides of the semiconductor layers 108 in the X-direction. The source/drain features 140 are connected to and in contact with the semiconductor layers 108. More specifically, the source/drain features 140 are attached and electrically connected to the semiconductor layers 108 in the X-direction. As shown in FIG. 19, the source/drain features are also in contact with the inner spacers 138 (more specifically, the liner layers 132-2 of the inner spacers 138), but are electrically isolated from the inner spacers 138. In some aspects, the inner spacers 138 are disposed between the source/drain features and the dummy gate structure 116 in the X-direction.

In some aspects, the semiconductor layers 108 serve as channels to connect one source/drain feature 140-1 to the other source/drain feature 140-2. Therefore, the semiconductor layers 108 may also be referred to as channels, channel layers, or channel members. In some embodiments, in the X-Z cross-sectional view shown in FIG. 19, the source/drain features 140-1 and 140-2 may have top surfaces that extend higher than top surfaces of the topmost semiconductor layers 108 (e.g., in the Z-direction), as shown in FIG. 19. In some embodiments, in the X-Z cross-sectional view shown in FIG. 19, the source/drain features 140-1 and 140-2 may have the top surfaces that extend higher than bottom surfaces of the gate spacers 124 (e.g., in the Z-direction). In other embodiments, the top surfaces of the source/drain features 140-1 and 140-2 are substantially level with the top surfaces of the topmost semiconductor layers 108 (i.e., substantially coplanar). As discussed in FIG. 10, the portions of the substrate 102 are etched so that the source/drain trenches 126 each has the concave surface in the substrate 102, thereby the source/drain features 140-1 and 140-2 have convex bottom surfaces.

One or more epitaxy processes may be employed to grow the source/drain features 140-1 and 140-2. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 140 may include any suitable semiconductor materials. For example, the source/drain features 140 used for P-type GAA transistor may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 140 may be doped with P-type dopants (such as boron, indium, other P-type dopant, or a combination thereof) having a doping concentration in a range from about $1\times10^{19}/cm^3$ to $6\times10^{20}/cm^3$. In some embodiments, the source/drain features 140 for P-type GAA transistors may respectively be referred to as P-type GAA source/drain features. The source/drain features 140-1 and 140-2 may also be referred to as source/drain, or source/drain regions. In some embodiments, source/drain feature(s) 140 may refer to a source or a drain, individually or collectively dependent upon the context. The source/drain features 140 may be doped in-situ or ex-situ. One or more annealing processes may be performed to activate the dopants in the source/drain features 140. The annealing processes may include rapid thermal annealing (RTA) and/or laser annealing processes.

Figure 20:
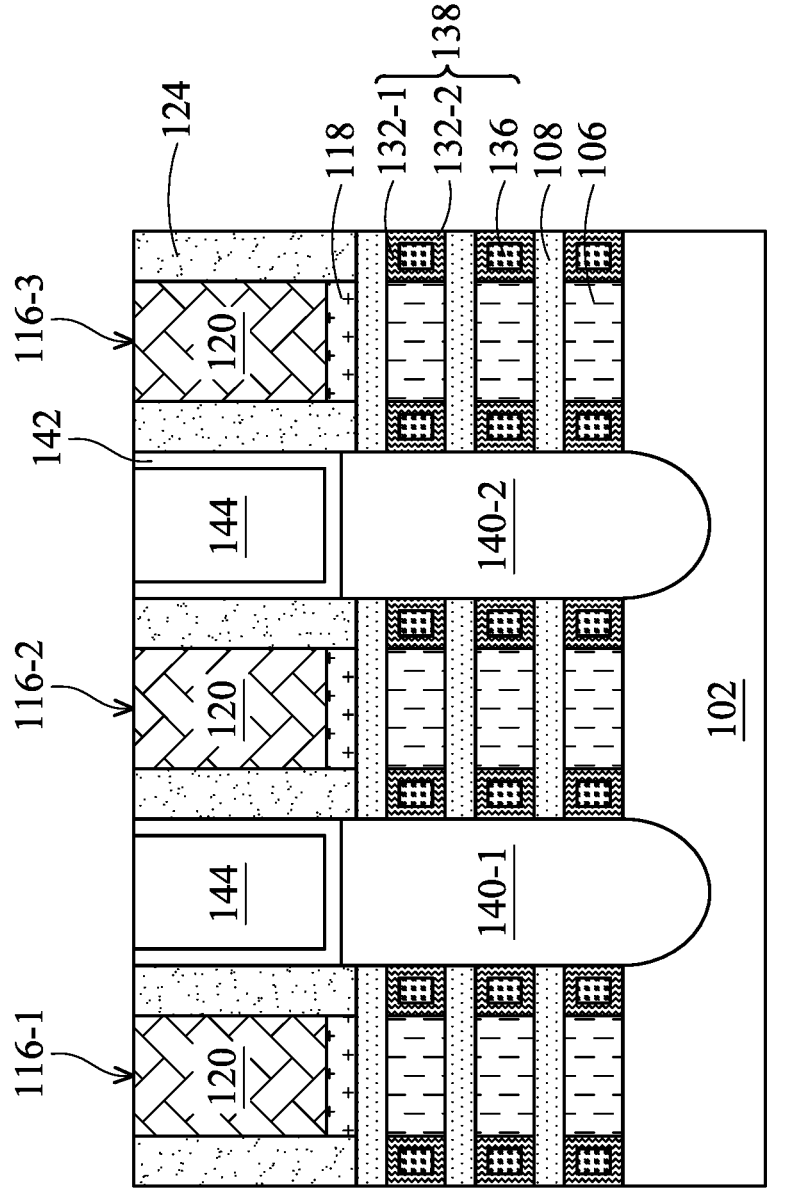
Figure 20:
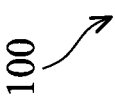
Figure 20:
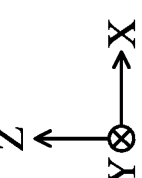

Referring to FIG. 20, a contact etch stop layer (CESL) 142 over the source/drain features 140-1 and 140-2 and an interlayer dielectric (ILD) layer 144 over the CESL 142 are formed to fill the spaces between the gate spacers 124 and in the source/drain trenches 126. Specifically, the CESL 142 is conformally formed on the sidewalls of the gate spacers 124, over the top surfaces of the source/drain features 140-1 and 140-2, as shown in FIG. 20. The ILD layer 144 is then formed over the CESL 142 to fill a remaining space between (or inside) the CESL 142, between the gate spacers 124 and in the source/drain trenches 126.

The CESL 142 includes a material that is different than ILD layer 144. The CESL 142 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 144 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 144 may be formed by PECVD (plasma enhanced CVD), FCVD (flowable CVD), or other suitable methods.

Subsequent to the deposition of the CESL 142 and the ILD layer 144, a CMP process and/or other planarization process is performed on the CESL 142, the ILD layer 144, the gate spacers 124, and the hard mask layers 122 until the top surfaces of the dummy gate electrodes 120 are exposed. In some embodiments, portions of the dummy gate electrodes 120 are removed after the planarization process. In some embodiments, the ILD layer 144 is recessed to a level below the top surface of the dummy gate electrode 120, and then an ILD protection layer is formed over the ILD layer 144 to protect the ILD layer 144 from subsequent etching processes. As such, the ILD layer 144 is surrounded by the CESL 142 and the ILD protection layer. In some embodiments, the ILD protection layer includes a material that is the same as or similar to that in the CESL 142. In some other embodiments, the ILD protection layer includes a dielectric material such as $Si_3N_4$, SiCN, SiOCN, SiOC, a metal oxide such as $HrO_2$, $ZrO_2$, hafnium aluminum oxide, hafnium silicate, or other suitable material, and may be formed by CVD, PVD, ALD, or other suitable methods.

Figure 21:
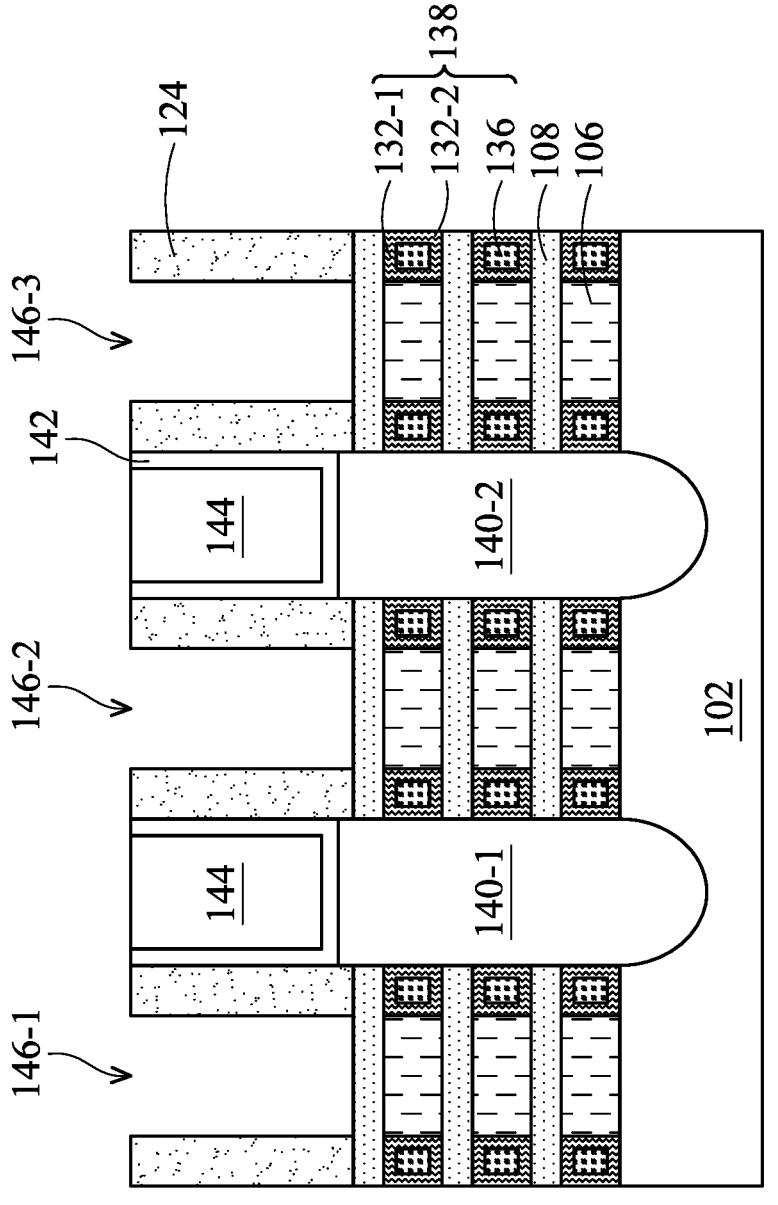

Referring to FIG. 21, the dummy gate structures 116 are selectively removed through any suitable lithography and etching processes to form gate trenches 146 (including gate trenches 146-1 to 146-3). In some embodiments, the lithography process may include forming a photoresist layer (resist), exposing the resist to a pattern, performing a post-exposure bake process, and developing the resist to form a masking element, which exposes a region including the dummy gate structures 116. Then, the dummy gate structures 116 are selectively etched through the masking element. The gate spacers 124 may be used as the masking element or a part thereof. Etch selectivity may be achieved by selecting the appropriate etching chemicals, and the dummy gate electrode 120 may be removed without substantially affecting the CESL 142 and the ILD layer 144. The removal of the dummy gate structures 116 creates the gate trenches 146-1 to 146-3, in which the gate trenches 146-1 to 146-3 expose the top surfaces of the fin 112 (specifically, the top surfaces of the topmost semiconductor layers 108).

Figure 22:
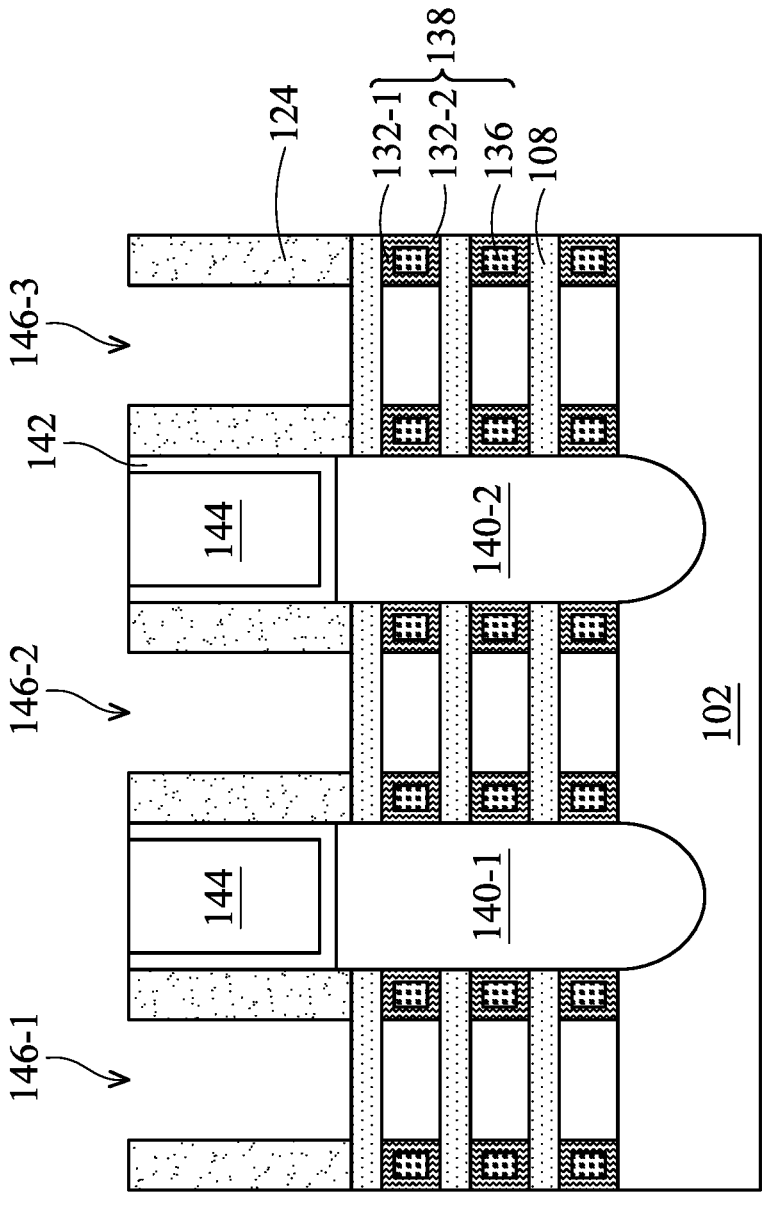
Figure 22:
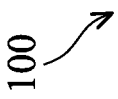
Figure 22:
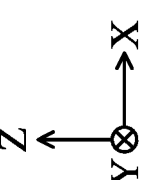

Referring to FIG. 22, the semiconductor layers 106 of the fin 112 are selectively removed through the gate trenches 146, using a wet or dry etching process for example, so that middle portions of the semiconductor layers 108 are exposed in the gate trenches 146 to form nanostructures stacked over each other, which serving as channels, channel layers, or channel members for resultant transistors. As such, the semiconductor layers 108 may be referred to as nanostructures. Specifically, the semiconductor layers 108 are stacked over each other in the Z-direction. Such a process may also be referred to as a release process, a channel release process, a wire release process, a nanowire release process, a nanosheet release process, a nanowire formation process, a nanosheet formation process, or a wire formation process.

In some embodiments, the removal of the semiconductor layers 106 causes the exposed semiconductor layers 108 to be spaced apart from each other in the vertical direction (e.g., in the Z-direction). The exposed semiconductor layers 108 extend longitudinally in the horizontal direction (e.g., in the X-direction). As shown in FIG. 22, sidewalls of the inner spacers 138 (more specifically, the liner layers 132-1 of the inner spacers 138) are also exposed in the gate trenches 146. Furthermore, each of the semiconductor layers 108 connects one source/drain feature 140-1 to the other source/drain feature 140-2 (e.g., shown in FIG. 22). In some embodiments, thicknesses of the semiconductor layers 108 exposed in the gate trenches 146 may be reduced during the removal of the semiconductor layers 106. In other embodiments, heights of the substrate 102 exposed in the gate trenches 146 may also be reduced during the removal of the semiconductor layers 106.

Referring to FIG. 23, gate structures 148 (including gate structures 148-1 to 148-3) are formed in the gate trenches 146 to wrap around the middle portions of the exposed semiconductor layers 108 (the nanostructures). As such, the gate structures 148 replace the dummy gate structures 116. In some embodiments, the gate structures 148 also extend in the Y-direction (not shown, but may refer to the dummy gate structures 116 shown in FIG. 8). As shown in FIG. 23, the source/drain features 140-1 and 140-2 are disposed on opposite sides of the gate structure 148-2 in the X-direction. The gate structures 148 each includes gate dielectric layer 150 and gate electrode 152 over the gate dielectric layer 150. In some embodiments, the gate dielectric layers 150 are formed to wrap around the semiconductor layers 108 in the gate trenches 146. Additionally, the gate dielectric layers 150 also formed on the sidewalls of the inner spacers 138 (more specifically, the liner layers 132-1 of the inner spacers 138) and the gate spacers 124.

The gate dielectric layers 150 may include a dielectric material having a dielectric constant greater than a dielectric constant of $SiO_2$, which is approximately 3.9. For example, the gate dielectric layers 150 may include hafnium oxide ($HfO_2$), which has a dielectric constant in a range from about 18 to about 40. Alternatively, the gate dielectric layers 150 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layers 150 may be formed by ALD, PVD, CVD, oxidation, and/or other suitable methods.

In some embodiments, the gate structures 148 each may further include interfacial layer formed to wrap around the exposed semiconductor layers 108 before the formation of the gate dielectric layers 150, so that the gate dielectric layers 150 are separated from semiconductor layers 108 by the interfacial layer. In some embodiments, the interfacial layer may include a dielectric material such as silicon oxide ($SiO_2$), HfSiO, or silicon oxynitride (SiON). The interfacial layer may be formed by chemical oxidation, thermal oxidation, ALD, CVD, and/or other suitable method.

The gate electrodes 152 are formed to fill the remaining spaces of the gate trenches 146, and over the gate dielectric layers 150 in such a way that the gate electrodes 152 wrap around the semiconductor layers 108, the gate dielectric layers 150, and the interfacial layers (if present). The gate electrodes 152 each may include a single layer or alternatively a multi-layer structure. In some embodiments, the gate electrodes 152 each may include a capping layer, a barrier layer, work function metal layers, and a fill material. In some embodiments, the gate electrodes 152 may have P-type work function metal layers for P-type GAA transistors.

The capping layer may be formed adjacent to the gate dielectric layers 150 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

In an embodiment, the P-type work function metal layer may be a material such as TiN, TaN, Ru, Mo, Al, WN, ZrSi2, MoSi2, TaSi2, NiSi2, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the P-type work function metal layer may be deposited using a deposition process such as ALD, CVD, or the like, although any suitable deposition process may be used.

Figure 24:
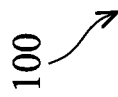
Figure 24:
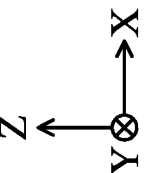

Referring to FIG. 24, silicide features 154 and source/drain contacts 156 are formed. More specifically, as shown in FIG. 24, the silicide features 154 are formed over the source/drain features 140, and the source/drain contacts 156 are formed over the silicide features 154 and the source/drain features 140, and passing through the CESL 142 and the ILD layer 144. In some embodiments, portions of the source/drain feature 140 is removed during the formation of the silicide features 154 and the source/drain contact 156. The source/drain contacts 156 are electrically connected to (top surfaces of) the source/drain features 140 through the silicide features 154.

In some embodiment, the silicide feature 154 is between the adjacent two gate structures 148 in the X-direction. The silicide features 154 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

The conductive material of the source/drain contacts 156 may include Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 156 may include single conductive material layer or multiple conductive layers.

Figures 25A, 25B:
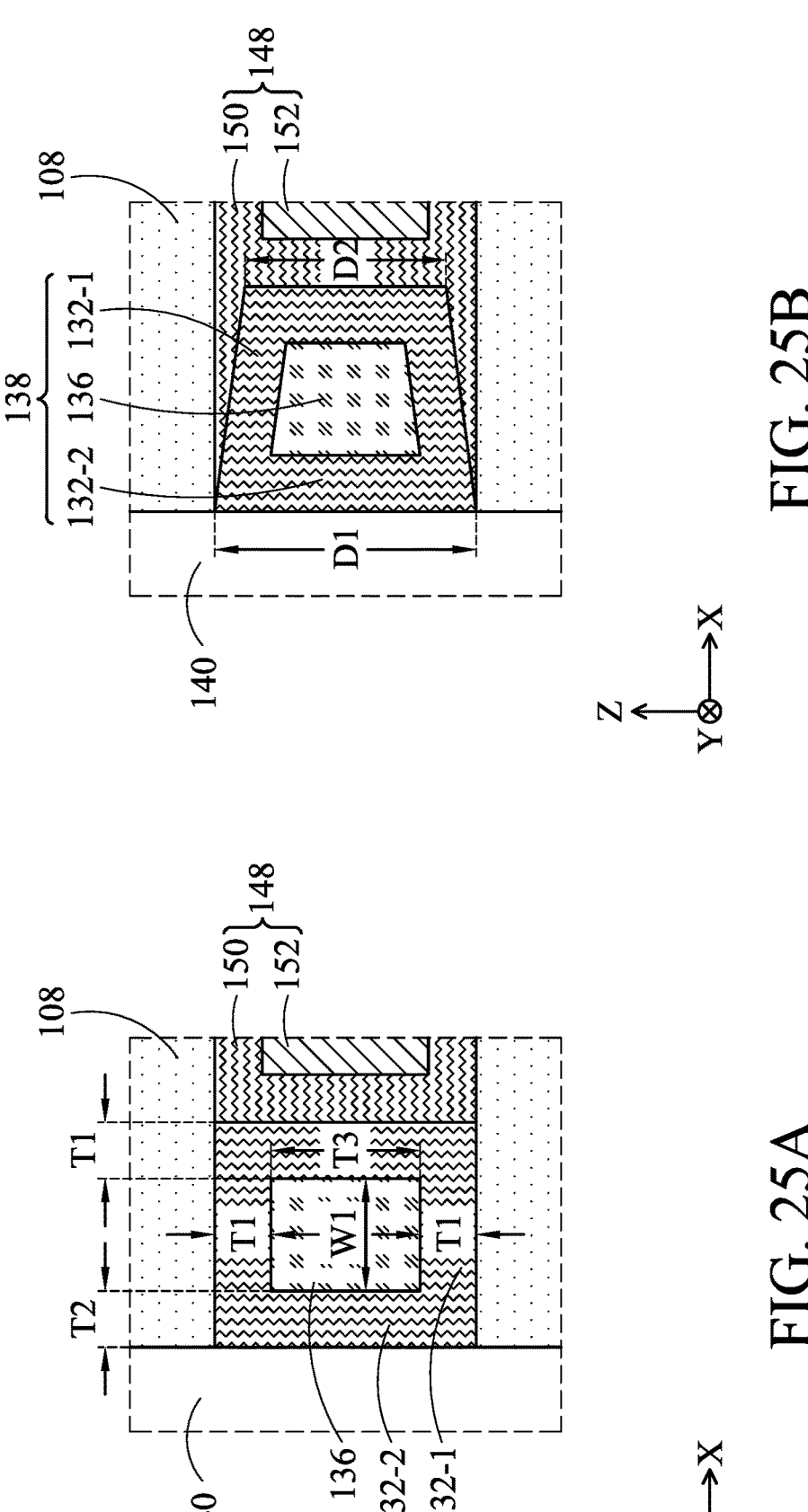
FIG. 25A is a partial enlarged cross-sectional view of the workpiece at the fabrication stage in a dashed box of FIG. 24, in accordance with some embodiments of the present disclosure.
FIG. 25B is a partial enlarged cross-sectional view of the workpiece at the fabrication stage in the dashed box of FIG. 24, in accordance with some alternative embodiments of the present disclosure.

FIG. 25A is a partial enlarged cross-sectional view of the workpiece 100 at the fabrication stage in a dashed box 158 of FIG. 24, in accordance with some embodiments of the present disclosure. Referring to FIGS. 24 and 25A, after the formation of the silicide features 154 and the source/drain contacts 156, the workpiece 100 with semiconductor structure including a GAA transistor 160 is provided. As discussed above, the source/drain features 140 may be doped with P-type dopants and the gate electrodes 152 may have P-type work function metal layers. Therefore, the GAA transistor 160 is a P-type GAA transistor, in accordance with some embodiments.

In some embodiments, the source/drain features 140 may be designed to apply compressive stress to channels (i.e., the semiconductor layers 108) in the GAA transistor 160, thereby enhancing the carrier (e.g., hole) mobility and the performance of the GAA transistor 160. In order to reduce that the inner spacers 138 affect the stress propagation from the source/drain features 140 to the semiconductor layers 108, in the present embodiments, the inner spacers 138 includes the core layers 136. As discussed above, the core layers 136 is softer than the liner layers 132 and the Young's modulus of the core layers 136 are less than 0.8 times of the Young's modulus of the liner layers 132. Mechanical properties of such inner spacers 138 are improved to increase the compressive stress toward the semiconductor layers 108, thereby improving the performance of the GAA transistor 160. Furthermore, the liner layers 132 separate the core layers 136 from the semiconductor layer 108, the gate structures 148, and the source/drain features 140. Such liner layers 132 wrapping around the core layers 136 maintain the process stability for etching resistance.

In some embodiments, the core layers 136 include low-k oxide. More specifically, the dielectric constant of the core layers 136 are less than the dielectric constant of the liner layers 132, in which the dielectric constant of the core layers 136 are less than 3.9. Such inner spacers 138 with low-k core layers 136 reduce the parasitic capacitance of the GAA transistor 160.

As shown in FIG. 25A, each of the inner spacers 138 has a rectangle shape in an X-Z cross-sectional view, in accordance with some embodiments. More specifically, each of the core layers 136 has a rectangle shape and each of the liner layers 132 has a hollow rectangle shape wrapping around the core layers 136 in the X-Z cross-sectional view. The thickness of the inner spacers 138 in the Z-direction is greater than the width of the inner spacers 138 in the X-direction. In other words, the thickness T3 of the core layers 136 in the Z-direction is also greater than the width W1 of the core layers 136 in the X-direction, as shown in FIG. 25A. In some embodiments, the thickness T3 of the core layers 136 in the Z-direction is in a range from about 4 nm to about 7 nm. The width W1 of the core layers 136 in the X-direction is in a range from about 1 nm to about 3 nm.

In some embodiments, each of the liner layers 132 includes the liner layer 132-1 having a thickness T1 and the liner layer 132-2 having a thickness T2, as shown in FIG. 25A. The thickness T1 of the liner layers 132-1 and the thickness T2 of the liner layers 132-2 each is in a range from about 0.5 nm to about 1.5 nm. In some embodiments, the thickness T2 of the liner layers 132-2 in contact with the source/drain features 140 in the X-direction is greater than the thickness T1 of the liner layers 132-1 in contact with the gate structures 148 in the X-direction. In these embodiments, the process stability of the liner layers 132-2 is improved.

As discussed above, the inner spacers 138 including the liner layers 132 and the core layers 136 are used for reducing the impact of the inner spacers 138 to the stress propagation from the source/drain features 140 to the semiconductor layers 108. If the thickness T3 of the core layers 136 in the Z-direction and/or the width W1 of the core layers 136 in the X-direction are too small (the thickness T3 is less than about 4 nm and/or the width W1 is less than about 1 nm) and/or the thicknesses T1 and T2 are too large (the thicknesses T1 and T2 are greater than about 1.5 nm), the impact of the inner spacers 138 to the stress propagation from the source/drain features 140 to the semiconductor layers 108 cannot be significantly reduced. If the thickness T3 of the core layers 136 in the Z-direction and/or the width W1 of the core layers 136 in the X-direction are too large (the thickness T3 is greater than about 7 nm and/or the width W1 is greater than about 3 nm) and/or the thicknesses T1 and T2 are too small (the thicknesses T1 and T2 are less than about 0.5 nm), the process stability may be impacted.

FIG. 25B is a partial enlarged cross-sectional view of the workpiece 100 at the fabrication stage in the dashed box 158 of FIG. 24, in accordance with some alternative embodiments of the present disclosure. The inner spacer 138 shown in FIG. 25B is similar to the inner spacer 138 shown in FIG. 25A discussed above, except that the inner spacer 138 has a trapezoid shape in the X-Z cross-sectional view. As shown in FIG. 25B, each of the core layers 136 also has a trapezoid shape and each of the liner layers 132 has a hollow trapezoid shape wrapping around the core layers 136 in the X-Z cross-sectional view. The dimension D1 of sidewalls of the inner spacers 138 in contact with the source/drain features 140 in the X-direction is greater than the dimension D2 of sidewalls of the inner spacers 138 in contact with the gate structures 148 in the X-direction. In other words, the dimension D1 of sidewalls of the liner layers 132-2 in contact with the source/drain features 140 in the X-direction is greater than the dimension D2 of sidewalls of the liner layers 132-1 in contact with the gate structures 148 in the X-direction. Furthermore, the dimension of sidewalls of the core layers 136 in contact with liner layers 132-2 is also greater than the dimension of sidewalls of the core layers 136 in contact with the liner layers 132-1.

Figures 25C, 25D:
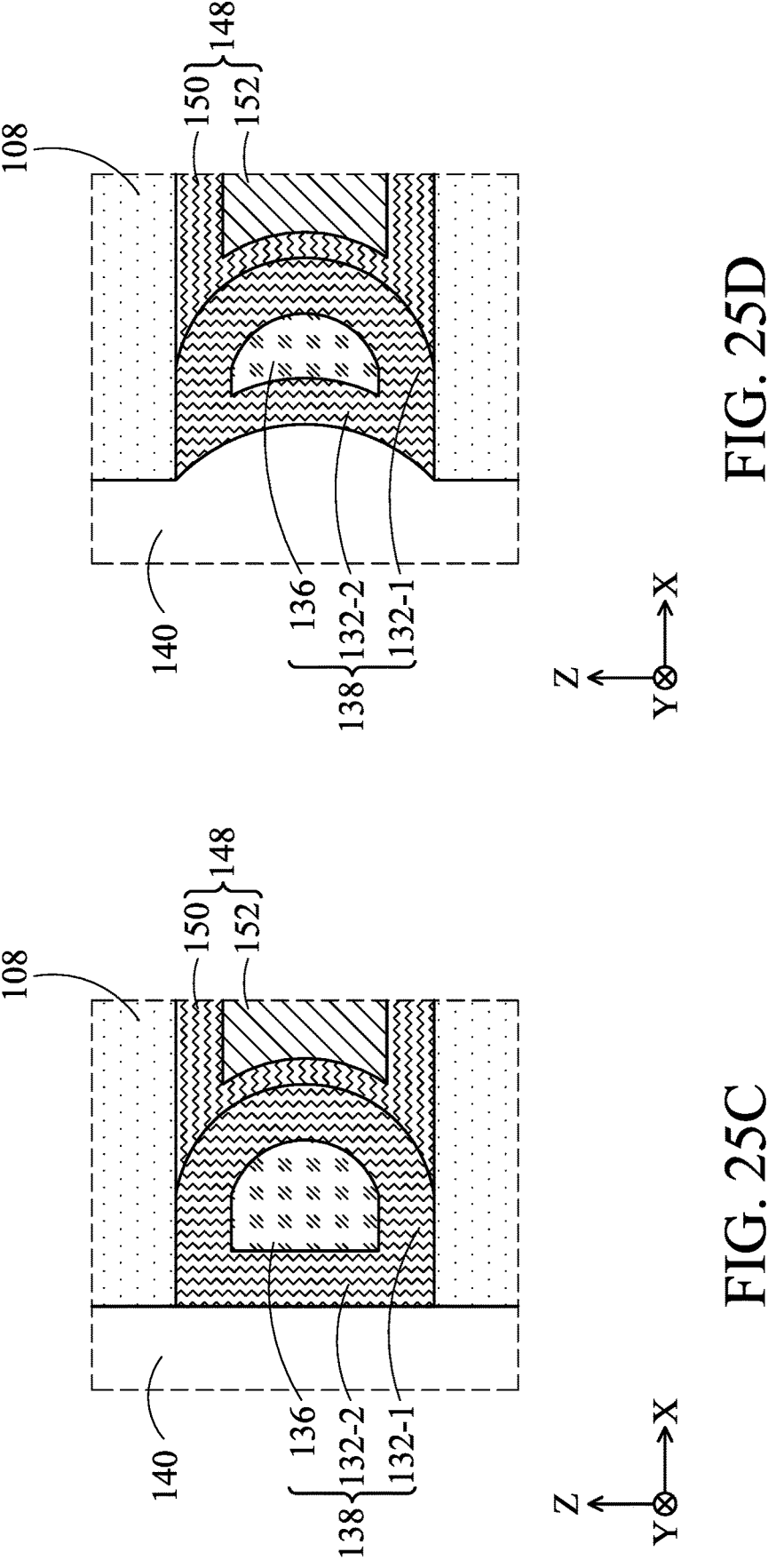
FIG. 25C is a partial enlarged cross-sectional view of the workpiece at the fabrication stage in the dashed box of FIG. 24, in accordance with some alternative embodiments of the present disclosure.
FIG. 25D is a partial enlarged cross-sectional view of the workpiece at the fabrication stage in the dashed box of FIG. 24, in accordance with some alternative embodiments of the present disclosure.

FIG. 25C is a partial enlarged cross-sectional view of the workpiece 100 at the fabrication stage in the dashed box 158 of FIG. 24, in accordance with some alternative embodiments of the present disclosure. The inner spacer 138 shown in FIG. 25C is similar to the inner spacer 138 shown in FIG. 25A discussed above, except that the inner spacer 138 has a half ellipse shape in the X-Z cross-sectional view. As shown in FIG. 25C, each of the core layers 136 also has a half ellipse shape and each of the liner layers 132 has a hollow half ellipse shape wrapping around the core layers 136 in the X-Z cross-sectional view. More specifically, the inner spacers 138 have vertical sidewalls in contact with the source/drain features 140 and convex sidewalls are in contact with the gate structures 148. Therefore, each of the liner layers 132 also includes a vertical sidewall in contact with the source/drain feature 140 and a convex sidewall in contact with the gate structure 148.

FIG. 25D is a partial enlarged cross-sectional view of the workpiece 100 at the fabrication stage in the dashed box 158 of FIG. 24, in accordance with some alternative embodiments of the present disclosure. The inner spacer 138 shown in FIG. 25D is similar to the inner spacer 138 shown in FIG. 25A discussed above, except that the inner spacer 138 has a crescent shape in the X-Z cross-sectional view. As shown in FIG. 25D, each of the core layers 136 also has a crescent shape and each of the liner layers 132 has a hollow crescent shape wrapping around the core layers 136 in the X-Z cross-sectional view. More specifically, the inner spacers 138 have concave sidewalls in contact with the source/drain features 140 and convex sidewalls are in contact with the gate structures 148. Therefore, each of the liner layers 132 also includes a concave sidewall in contact with the source/drain feature 140 and a convex sidewall in contact with the gate structure 148.

Figure 26:
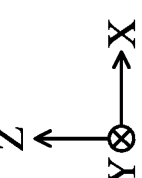
FIG. 26 is an X-Z cross-sectional view of the workpiece at the fabrication stage along the line A-A' of FIG. 9, in accordance with some alternative embodiments of the present disclosure.

FIG. 26 is an X-Z cross-sectional view of the workpiece at the fabrication stage along the line A-A' of FIG. 9, in accordance with some alternative embodiments of the present disclosure. The inner spacers 138 shown in FIG. 26 is similar to the inner spacers 138 shown in FIG. 24 discussed above, except that the core layers 136 of the inner spacer 138 are removed. More specifically, after the formation of the inner spacers 138 shown in FIG. 18, additional processes are performed to remove the core layers 136. Therefore, the inner spacers 138 become the liner layers 132 wrapping around air 162. The air 162 has very low dielectric constant. Therefore, the parasitic capacitance of the GAA transistor 160 are greatly reduced.

The embodiments disclosed herein relate to semiconductor structures and their manufacturing methods, and more particularly to methods and semiconductor structures including P-type GAA transistors with inner spacers having core layers wrapped around by liner layers. Furthermore, the present embodiments provide one or more of the following advantages. The inner spacers having the core layers wrapped around by the liner layers reduce the impact of the inner spacers to the stress propagation from the source/drain features to the nanostructures. Therefore, the compressive stress from source/drain features to nanostructures in the P-type GAA transistors are improved, thereby improving the performance of the P-type GAA transistors. Furthermore, the liner layers improve the process stability. In addition, the inner spacers with low-k core layers reduce the parasitic capacitance of the P-type GAA transistor.

Thus, one of the embodiments of the present disclosure describes a semiconductor structure that includes a substrate, nanostructures, source/drain features, a gate structure, and inner spacers. The nanostructures are over the substrate and spaced apart from each other in a Z-direction. The source/drain features are electrically connected to and on opposite sides of the nanostructures in an X-direction. The gate structure extends in a Y-direction and wraps around the nanostructures. The inner spacers are between the nanostructures in the Z-direction. Each of the inner spacers includes a soft core layer and a hard liner layer wrapping around the soft core layer.

In some embodiments, a Young's modulus of the hard liner layer is greater than a Young's modulus of the soft core layer.

In some embodiments, the soft core layer comprises low-k oxides, amorphous carbon, polymers, and air, and the hard liner layer comprises SiN, SiCN, $SiO_x$, SiCO, and SiCON.

In some embodiments, a thickness of the soft core layer in the Z-direction is greater than a width of the soft core layer in the X-direction.

In some embodiments, the thickness of the soft core layer in the Z-direction is in a range from about 4 nm to about 7 nm and the width of the soft core layer in the X-direction is in a range from about 1 nm to about 3 nm.

In some embodiments, a thickness of the hard liner layers is in a range from about 0.5 nm to about 1.5 nm.

In some embodiments, the thickness of the hard liner layers in contact with the source/drain features in the X-direction is greater than the thickness of the hard liner layers in contact with the gate structure in the X-direction.

In some embodiments, a dimension of sidewalls of the hard liner layers in contact with the source/drain features in the Z-direction is greater than a dimension of sidewalls of the hard liner layers in contact with the gate structure in the Z-direction.

In some embodiments, each of the hard liner layers comprises a vertical sidewall in contact with the source/drain feature and a convex sidewall in contact with the gate structure.

In some embodiments, each of the hard liner layers comprises a concave sidewall in contact with the source/drain feature and a convex sidewall in contact with the gate structure.

In another of the embodiments, discussed is a semiconductor structure including a substrate, nanostructures, a gate structure, source/drain features, and inner spacers. The nanostructures are over the substrate and spaced apart from each other in a Z-direction. The gate structure extends in a Y-direction and wraps around middle portions of the nanostructures. The source/drain features are on opposite sides of the gate structure in an X-direction and attached to the nanostructures in the X-direction. The inner spacers are between side portions of the nanostructures in the Z-direction. Each of the inner spacers includes a soft core layer and a hard liner layer wrapping around the soft core layer. The liner layers separate the core layers from the nanostructures, the gate structure, and the source/drain features.

In some embodiments, a Young's modulus of the soft core layer is less than 0.8 times of a Young's modulus of the hard liner layer.

In some embodiments, a dielectric constant of the soft core layer is less than a dielectric constant of the hard liner layer, wherein the dielectric constant of the soft core layer is less than 3.9.

In some embodiments, each of the inner spacers has a rectangle shape in an X-Z cross-sectional view. A thickness of the inner spacers in the Z-direction is greater than a width of the inner spacers in the X-direction.

In some embodiments, each of the inner spacers has a trapezoid shape in an X-Z cross-sectional view. A dimension of sidewalls of the inner spacers in contact with the source/drain features in the Z-direction is greater than a dimension of sidewalls of the inner spacers in contact with the gate structure in the Z-direction.

In some embodiments, each of the inner spacers has a half ellipse shape in an X-Z cross-sectional view. Vertical sidewalls of the inner spacers are in contact with the source/drain features and convex sidewalls of the inner spacers are in contact with the gate structure.

In some embodiments, each of the inner spacers has a crescent shape in an X-Z cross-sectional view. Concave sidewalls of the inner spacers are in contact with the source/drain feature and convex sidewalls of the inner spacers are in contact with the gate structure.

In yet another of the embodiments, discussed is a method for manufacturing a semiconductor structure including forming a fin over a substrate. The fin includes first semiconductor layers and second semiconductor layers alternating stacked in a Z-direction. The method further includes forming a dummy gate structure extending in a Y-direction and over the fin, forming gate spacers on sidewalls of the dummy gate structure in an X-direction, forming source/drain trenches in the fin and on opposite sides of the dummy gate structures in the X-direction, removing side portions of the first semiconductor layers through the source/drain trenches to form gaps between the second semiconductor layers in the Z-direction and direct under the gate spacers, forming first liner layers partially filling the gaps, forming core layers partially filling spaces in the gaps and the first liner layers, forming second liner layers filling remaining spaces in the gaps, forming P-type source/drain features in the source/drain trenches, and replacing the dummy gate structure and the first semiconductor layers with a gate structure wrapping around the second semiconductor layers.

In some embodiments, the method further includes forming first liner material partially filling the gaps and on sidewalls of the gate spacers and the second semiconductor layers, trimming the first liner material to reduce thickness of the first liner material, and removing the first liner material on sidewalls of the gate spacers and the second semiconductor layers to form the first liner layers.

In some embodiments, the method further includes forming core material filling the gaps and on sidewalls of the gate spacers and the second semiconductor layers, removing the core material on sidewalls of the gate spacers and the second semiconductor layers and portions of the core material in the gaps to form the core layers, forming second liner material filling the gaps and on sidewalls of the gate spacers and the second semiconductor layers, and removing the second liner material on sidewalls of the gate spacers and the second semiconductor layers to form the second liner layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate;

nanostructures over the substrate and spaced apart from each other in a Z-direction;

source/drain features electrically connected to and on opposite sides of the nanostructures in an X-direction;

a gate structure extending in a Y-direction and wrapping around the nanostructures; and inner spacers between the nanostructures in the Z-direction, wherein each of the inner spacers comprises:

a soft core layer; and a hard liner layer wrapping around the soft core layer.

2. The semiconductor structure of claim 1, wherein a Young's modulus of the hard liner layer is greater than a Young's modulus of the soft core layer.

3. The semiconductor structure of claim 2, wherein the soft core layer comprises low-k oxides, amorphous carbon, polymers, and air, and the hard liner layer comprises SiN, SiCN, $SiO_x$, SiCO, and SiCON.

4. The semiconductor structure of claim 1, wherein a thickness of the soft core layer in the Z-direction is greater than a width of the soft core layer in the X-direction.

5. The semiconductor structure of claim 4, wherein the thickness of the soft core layer in the Z-direction is in a range from about 4 nm to about 7 nm and the width of the soft core layer in the X-direction is in a range from about 1 nm to about 3 nm.

6. The semiconductor structure of claim 1, wherein a thickness of the hard liner layers is in a range from about 0.5 nm to about 1.5 nm.

7. The semiconductor structure of claim 6, wherein the thickness of the hard liner layers in contact with the source/drain features in the X-direction is greater than the thickness of the hard liner layers in contact with the gate structure in the X-direction.

8. The semiconductor structure of claim 1, wherein a dimension of sidewalls of the hard liner layers in contact with the source/drain features in the Z-direction is greater than a dimension of sidewalls of the hard liner layers in contact with the gate structure in the Z-direction.

9. The semiconductor structure of claim 1, wherein each of the hard liner layers comprises a vertical sidewall in contact with the source/drain feature and a convex sidewall in contact with the gate structure.

10. The semiconductor structure of claim 1, wherein each of the hard liner layers comprises a concave sidewall in contact with the source/drain feature and a convex sidewall in contact with the gate structure.

11. A semiconductor structure, comprising:

a substrate;

nanostructures over the substrate and spaced apart from each other in a Z-direction;

a gate structure extending in a Y-direction and wrapping around middle portions of the nanostructures;

source/drain features on opposite sides of the gate structure in an X-direction and attached to the nanostructures in the X-direction; and inner spacers between side portions of the nanostructures in the Z-direction, wherein each of the inner spacers comprises:

a soft core layer; and a hard liner layer wrapping around the soft core layer, wherein the hard liner layers separate the core layers from the nanostructures, the gate structure, and the source/drain features.

12. The semiconductor structure of claim 11, wherein a Young's modulus of the soft core layer is less than 0.8 times of a Young's modulus of the hard liner layer.

13. The semiconductor structure of claim 11, wherein a dielectric constant of the soft core layer is less than a dielectric constant of the hard liner layer, wherein the dielectric constant of the soft core layer is less than 3.9.

14. The semiconductor structure of claim 13, wherein each of the inner spacers has a rectangle shape in an X-Z cross-sectional view, wherein a thickness of the inner spacers in the Z-direction is greater than a width of the inner spacers in the X-direction.

15. The semiconductor structure of claim 11, wherein each of the inner spacers has a trapezoid shape in an X-Z cross-sectional view, wherein a dimension of sidewalls of the inner spacers in contact with the source/drain features in the Z-direction is greater than a dimension of sidewalls of the inner spacers in contact with the gate structure in the Z-direction.

16. The semiconductor structure of claim 11, wherein each of the inner spacers has a half ellipse shape in an X-Z cross-sectional view, wherein vertical sidewalls of the inner spacers are in contact with the source/drain features and convex sidewalls of the inner spacers are in contact with the gate structure.

17. The semiconductor structure of claim 11, wherein each of the inner spacers has a crescent shape in an X-Z cross-sectional view, wherein concave sidewalls of the inner spacers are in contact with the source/drain feature and convex sidewalls of the inner spacers are in contact with the gate structure.

18. A method for manufacturing a semiconductor structure, comprising:

forming a fin over a substrate, wherein the fin comprises first semiconductor layers and second semiconductor layers alternating stacked in a Z-direction;

forming a dummy gate structure extending in a Y-direction and over the fin;

forming gate spacers on sidewalls of the dummy gate structure in an X-direction;

forming source/drain trenches in the fin and on opposite sides of the dummy gate structures in the X-direction;

removing side portions of the first semiconductor layers through the source/drain trenches to form gaps between the second semiconductor layers in the Z-direction and direct under the gate spacers;

forming first liner layers partially filling the gaps;

forming core layers partially filling spaces in the gaps and the first liner layers;

forming second liner layers filling remaining spaces in the gaps;

forming P-type source/drain features in the source/drain trenches; and replacing the dummy gate structure and the first semiconductor layers with a gate structure wrapping around the second semiconductor layers.

19. The method of claim 18, further comprising:

forming first liner material partially filling the gaps and on sidewalls of the gate spacers and the second semiconductor layers;

trimming the first liner material to reduce thickness of the first liner material; and removing the first liner material on sidewalls of the gate spacers and the second semiconductor layers to form the first liner layers.

20. The method of claim 19, further comprising:

forming core material filling the gaps and on sidewalls of the gate spacers and the second semiconductor layers;

removing the core material on sidewalls of the gate spacers and the second semiconductor layers and portions of the core material in the gaps to form the core layers;

forming second liner material filling the gaps and on sidewalls of the gate spacers and the second semiconductor layers; and removing the second liner material on sidewalls of the gate spacers and the second semiconductor layers to form the second liner layers.

* * * * *